(12) United States Patent
Wada

(10) Patent No.: US 8,753,962 B2
(45) Date of Patent: Jun. 17, 2014

(54) METHOD FOR PRODUCING EPITAXIAL WAFER

(75) Inventor: Naoyuki Wada, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/380,982

(22) PCT Filed: Jul. 8, 2010

(86) PCT No.: PCT/JP2010/004446
§ 371 (c)(1),
(2), (4) Date: Dec. 27, 2011

(87) PCT Pub. No.: WO2011/004602
PCT Pub. Date: Jan. 13, 2011

(65) Prior Publication Data
US 2012/0104565 A1 May 3, 2012

(30) Foreign Application Priority Data

| Jul. 8, 2009 | (JP) | 2009-161572 |
| Jul. 8, 2009 | (JP) | 2009-161675 |
| Jul. 24, 2009 | (JP) | 2009-172633 |
| Jul. 7, 2010 | (JP) | 2010-154603 |

(51) Int. Cl.
*H01L 29/04* (2006.01)
(52) U.S. Cl.
USPC .................... 438/478; 438/504; 257/E29.003

(58) Field of Classification Search
USPC .......................... 438/504, 478; 257/E29.003
See application file for complete search history.

(56) References Cited

U.S. PATENT DOCUMENTS

2002/0022351 A1 * 2/2002 Schmolke et al. ............ 438/504

FOREIGN PATENT DOCUMENTS

| JP | 2000-100737 | 4/2000 |
| JP | 2002-050579 | 2/2002 |
| JP | 2003-254741 | 9/2003 |
| JP | 2003-526731 | 9/2003 |
| JP | 2005-019898 | 1/2005 |
| JP | 2006-520096 | 8/2006 |
| JP | 2009-111296 | 5/2009 |
| WO | 2008/013032 | 1/2008 |

* cited by examiner

*Primary Examiner* — Thanh Nguyen
(74) *Attorney, Agent, or Firm* — Clark & Brody

(57) ABSTRACT

When a mixed gas of trichlorosilane and dichlorosilane is used as source gas, a silicon layer is epitaxially grown on a surface of a silicon wafer within a temperature range of 1000 to 1100° C., preferably, 1040 to 1080° C. When dichlorosilane is used as source gas, a silicon layer is epitaxially grown on a surface of a silicon wafer within a temperature range of 900 to 1150° C., preferably, 1000 to 1150° C. According to this, a silicon epitaxial wafer, which has low haze level, excellent flatness (edge roll-off), and reduced orientation dependence of epitaxial growth rate, and is capable of responding to the higher integration of semiconductor devices, can be obtained, and this epitaxial wafer can be used widely in production of semiconductor devices.

13 Claims, 3 Drawing Sheets

METHOD FOR PRODUCING EPITAXIAL WAFER

TECHNICAL FIELD

The present invention relates to an epitaxial wafer and a method for producing the same, specifically, an epitaxial wafer which has a low haze level, well controlled flatness (edge roll-off) and further in which orientation dependence of growth rate, that is, variation of the growth rate of epitaxial layer depending on crystal orientation of the wafer, is reduced, and a method for producing the same.

BACKGROUND ART

In accordance with the recent miniaturization of design rules due to higher integration, a particle size to be assuredly measured by laser surface inspection devices is also miniaturized. During this measurement, if a haze level of an epitaxial wafer is high, the haze becomes a noise component for particle measurement and interferes with the measurement of minute-size particles. Thus, a silicon epitaxial wafer used as a substrate for a highly-integrated semiconductor device requires reduction of the haze level.

Further, in accordance with the miniaturization of semiconductor devices, high flatness becomes required for wafers. An area where flatness is to be assured on a wafer surface also tends to extend, and users become to often demand the assurance for the flatness substantially over the whole surface of a wafer, that is, over an area from the center of a wafer to 2 mm inwardly away from the outer periphery thereof.

With respect to the flatness of wafer, particularly the edge portion of wafer is apt to sag to be below the central portion, and thus decreases an available region for device fabrication, thereby leading up to deterioration of device fabrication yield. This sagging phenomenon is called "Edge Roll-off".

Also for epitaxial wafers, the problem of this edge roll-off is important from the viewpoint of the device fabrication yield. To minimize the edge roll-off and to maintain satisfactory flatness is required for the epitaxial wafers. It should be noted that the edge roll-off includes not only a case where the edge portion of the wafer sags but also a case where the edge portion becomes higher than the center, depending on conditions.

Further, what to be noted regarding the flatness of epitaxial wafer is orientation dependence that the growth rate of epitaxial layer depends on crystal orientation of wafer. This is a phenomenon that, when <011> crystal orientation extending from the center of a wafer to the outer periphery thereof is taken as the reference as being 0°, the growth rate is high in orientations of 90°, 180°, 270° and 360° (namely, 0°), and the film thickness of epitaxial layer (hereinafter simply referred also to as "epitaxial film thickness") is increased.

The epitaxial film thickness is increased in these four orientations (or axially symmetrically), and recessed portions (valleys) are formed between neighboring orientations among them. Accordingly, this phenomenon can be called also "4-Fold Symmetry". Hereinafter, this orientation dependence of epitaxial growth rate is also simply called "orientation dependence of growth rate", and the "4-Fold Symmetry" is called "4FS" for short.

For example, in an epitaxial wafer of 300 mm or more in diameter, this orientation dependence of growth rate (4FS) prominently emerges, particularly, from a 148-mm radial position, and is much more intensified nearing the outer peripheral zone (the chamfer vicinity).

In the epitaxial wafer production that epitaxially grows silicon on a silicon substrate, a chemical vapor deposition (CVD) method is mainly used from the viewpoint of the crystallinity of epitaxial growth layer, mass productivity, simplicity of the apparatus and the like. In the CVD method, a source gas containing silicon (Si) is introduced into a reactor together with a carrier gas (generally $H_2$), and Si, which is generated by thermal decomposition or reduction of the source gas, is deposited as an epitaxial layer on the silicon substrate heated to a high temperature.

Examples of the Si-containing source gas (silicon source) include four gases of silicon tetrachloride ($SiCl_4$), trichlorosilane ($SiHCl_3$), dichlorosilane ($SiH_2Cl_2$), and monosilane ($SiH_4$). As industrially-used source gases, silicon tetrachloride and trichlorosilane are mainly used, and dichlorosilane is also partially used, while monosilane, which allow low-temperature growth, is also partially used.

The epitaxial growth rate is dependent on kinds of source gases, temperature, pressure, and the like. A temperature region, in which the epitaxial growth can be performed, (hereinafter simply referred also to as "growth temperature region") is qualitatively divided into two territories of reaction dominant one and feed (diffusion) dominant one. The reaction dominant territoy is located on a low-temperature side within the growth temperature region. In the reaction dominant territory, the growth rate becomes higher with temperature becoming higher.

On the other hand, the feed (diffusion) dominant territory (hereinafter referred to as "feed dominant territory") is located on the high-temperature side within the same temperature region and is a region where temperature dependence is small, and the epitaxial growth is generally performed in this feed dominant territory. When the source gas is trichlorosilane, the epitaxial growth temperature is not lower than 1100° C. When the source gas is dichlorosilane, the epitaxial growth temperature is not lower than 1000° C., which is lower than in case of trichlorosilane.

In the current production of epitaxial wafer of 300 mm in diameter, trichlorosilane is used as source gas from the viewpoint of higher growth rate, and 1100 to 1130° C. within the feed dominant territory is used as the growth temperature region. The haze level in this case is about 0.12 to 0.18 ppm, which is measured in DWN mode using a particle counter SP-1 of KLA-Tencor (hereinafter simply referred to as "measured in DWN mode), and the haze is likely to become the noise component when the measurement is made for particles as being 35 nm or more in size that is a target in a next-generation assurance Standard.

Further, the orientation dependence of growth rate (4FS) is obtained as described below. A <011> orientation is taken as a reference, an epitaxial film thickness along this reference orientation is characterized and this determined thickness is taken as 1. On the other hand, an epitaxial film thickness along an orientation of 45° relative to the reference orientation is obtained and this obtained film thickness is converted into a relative film thickness with respect to the reference film thickness (along the reference orientation). Then, the orientation dependence of growth rate (4FS) is obtained and is about 0.980.

Namely, the difference of the thickness (this difference is herein referred to as "gap intensity") is 0.020, or about 2% when expressed in percentage, and further reduction of the difference is desirable for maintaining satisfactory flatness of the epitaxial wafer. This gap intensity is not affected so much by the epitaxial growth rate and/or growth temperature.

To date, studies and developments on the production of epitaxial wafers with low haze level have been made. For example, Patent Literature 1 proposes a method, in which a growth temperature during epitaxial growth is set lower than an ordinary growth temperature by about 50 to 100° C.

Concretely, as shown in examples thereof, there is a description that, when trichlorosilane is used as source gas, a haze level shows a substantially minimum value under a growth temperature in the range of not lower than 950° C. to not higher than 1050° C. This allows the improvement in measurement accuracy with a particle counter and production of epitaxial wafers with minimized haze and good quality.

According to the method described in Patent Literature 1, the haze level can be substantially reduced, compared with a case in which general growth temperature (1100 to 1130° C.) is adopted. However, the growth temperature adopted therein is within the reaction dominant territory where temperature dependence of epitaxial growth rate is large, and it is considered that accurate control of the epitaxial film thickness is difficult. The minimum haze level described in the examples of the same literature is 0.5 ppm, which is a result of measurement in DWO mode by a KLA-Tencor particle counter (SP-2), and this value is not necessarily a low level.

With respect to the flatness of the epitaxial wafer, Patent Literature 2, for example, bases a notion such that uneven film thickness of epitaxial layer predominantly causes the deterioration of flatness of epitaxial wafer. Thus, Patent Literature 2 discloses a measurement method for epitaxial wafer. According to this method, the film thickness is measured by an FT-IR method (a method using a Fourier transform infrared spectrophotometer) at plural points for measuring film thickness, allocated on a wafer surface; the measured film thickness values are used to calculate a flatness for each site (a wafer surface is divided into unit areas each having a specific shape, the unit area being a site); each flatness is compared with reference flatness information; and thereby the quality of flatness is determined for each site of the epitaxial layer. In this case, SFQR (the difference between maximum height and minimum height as viewed from reference surface) can be adopted as an evaluation index of site flatness.

Although Patent Literature 2 does not refer to the above-mentioned orientation dependence of growth rate (4FS), it can be sufficiently predicted that the 4FS affects the flatness, expressed in SFQR, of outer peripheral sites (outer peripheral areas).

CITATION LIST

Patent Literature

PATENT LITERATURE 1: Japanese Patent Application Publication No. 2000-100737
PATENT LITERATURE 2: Japanese Patent Application Publication No. 2003-254741

SUMMARY OF INVENTION

Technical Problem

In the epitaxial wafer production by the CVD method, trichlorosilane is conventionally used as source gas in many cases. Particularly in the production of an epitaxial wafer of 300 mm in diameter, trichlorosilane is used as source gas.

In the present invention, the use of dichlorosilane as source gas for the silicon epitaxial wafer production that epitaxially grows a silicon on a silicon substrate by the CVD method was examined.

As described above with respect to the epitaxial growth temperature, since dichlorosilane is decomposed at a low temperature, compared with trichlorosilane, the temperature of the epitaxial growth temperature region can be reduced, compared with a case where trichlorosilane is used, and the haze level can be reduced by reducing the epitaxial growth temperature.

Based on such examinations, the present invention can be classified to a "first invention" through a "third invention" according to source gases to be used and the characteristics of the resulting silicon epitaxial wafer.

A "first invention" of the present invention is that a mixed gas of trichlorosilane and dichlorosilane is used as source gas to obtain an epitaxial wafer whose haze level is prevented from getting worse than that of a polished wafer.

A "second invention" is that dichlorosilane is used as source gas to obtain an epitaxial wafer whose haze level is prevented from getting worse than that of a polished wafer.

A "third invention" is that dichlorosilane is used as source gas to obtain an epitaxial wafer in which the orientation dependence of growth rate is reduced.

Accordingly, the "first invention" has an object to provide a silicon epitaxial wafer, in which haze level is low, flatness, particularly, edge roll-off which deteriorates the device fabrication yield, is kept low, and orientation dependence of epitaxial growth rate (4FS) is reduced, the silicon wafer being capable of corresponding to the higher integration of semiconductor devices, and a method for producing the same.

The "second invention" has an object to provide a silicon epitaxial wafer, in which haze level is low, and flatness, particularly, edge roll-off which deteriorates the device fabrication yield, is kept low, the silicon epitaxial wafer being capable of corresponding to the higher integration of semiconductor devices, and a method for producing the same.

The "third invention" has an object to provide a silicon epitaxial wafer in which the orientation dependence of growth rate (4FS) is reduced, that is, variation of the epitaxial growth rate depending on the crystal orientation of the wafer is reduced, further desirably, a silicon epitaxial wafer in which the flatness, evaluated with edge roll-off, is kept low, and a method for producing the same.

Solution to Problem

Solution to Problem of "First Invention"

Since dichlorosilane is decomposed at a lower temperature than trichlorosilane and enables the temperature of the epitaxial growth temperature region to be lower than a case where trichlorosilane is used, the present inventor attempted to use such dichlorosilane as source gas for the silicon epitaxial wafer production that epitaxially grows a silicon on a silicon substrate by the CVD method.

Namely, the present inventor conceived that the haze level can be reduced by reducing the epitaxial growth temperature. Under such a conception, the haze levels of epitaxial wafers, for which dichlorosilane was used as source gas, and which were obtained under various epitaxial growth temperatures over a wide range, were measured.

Based on results of these measurements, it was confirmed that, by using dichlorosilane, the haze levels are prevented from getting worse than that of a polished wafer (mirror-polished wafer) and satisfactory haze levels can be maintained. It was also found that, on the high-temperature side across 1050° C., the temperature dependence of haze level is noticeable, and the haze level becomes higher with the temperature being higher, on the other hand, on the low temperature side, the haze level shows a low value irrespective of the temperature.

Also with respect to the flatness evaluated with edge roll-off, it was confirmed that the flatness can be maintained within a low range equivalent to a current status (that is, in the conventional case in which trichlorosilane is used) by appropriately controlling the flow rate of dichlorosilane to be supplied into a CVD reactor.

The edge roll-off, referred to herein, is a value obtained by measuring the thickness of an epitaxial film by Fourier transform infrared spectroscopy (FTIR method). In case of an epitaxial wafer of 300 mm in diameter, the edge roll-off is represented by a difference of measured values at the 144 mm and 148-mm radial positions relative to the wafer center.

Furthermore, it was found that the use of dichlorosilane leads to large reduction of the orientation dependence of growth rate (4FS). This reduction is about 0.5% in terms of gap intensity, which corresponds to one fourth of a current status (about 2%).

However, it was revealed also that, when dichlorosilane is used as source gas, the epitaxial growth rate is noticeably reduced. Thus, in order to relax the reduction of epitaxial growth rate, the present inventor prepared epitaxial wafers by using a mixed gas of trichlorosilane and dichlorosilane as source gas and epitaxially growing silicon on silicon substrates under various mixing ratios thereof, and examined the resulting epitaxial wafers on the flatness, concretely, the edge roll-off and the orientation dependence of growth rate, in addition to the measurement of the haze level.

As a result, the following facts were found.

(a) The haze level is suddenly increased when the epitaxial growth temperature becomes 1050° C. or higher, irrespective of the kind of source gas or the mixing ratio of source gases.

(b) The deterioration of the edge roll-off becomes noticeable if the temperature region of epitaxial growth is out of the feed dominant territory.

(c) In consideration of the above-mentioned facts of (a) and (b), as a mixing ratio of source gases during the epitaxial growth, it is preferred to select a ratio so as to allow the feed dominant territory to exist in a temperature region lower than 1050° C.

(d) According as the ratio of trichlorosilane in source gas is increased, the orientation dependence of growth rate (4FS) is intensified, resulting in an increased gap intensity.

The first invention is achieved based on such knowledge, and the summary thereof lies in (1) a method for producing an epitaxial wafer and (2) an epitaxial wafer which can be produced by this method.

(1) A method for producing an epitaxial wafer by epitaxially growing a silicon layer on a surface of a silicon wafer, the method includes: using a mixed gas of trichlorosilane and dichlorosilane as source gas, and epitaxially growing the silicon layer within a temperature range of 1000 to 1100° C.; and preventing a haze level of the resulting epitaxial wafer from getting worse than that of a polished wafer, and making the resulting epitaxial wafer excellent in flatness.

The "flatness" referred to herein means a flatness evaluated with edge roll-off; however, the flatness may be evaluated also with the orientation dependence of epitaxial growth rate. The above-mentioned "excellent in flatness" means that the edge roll-off with which the flatness is to be evaluated is maintained in the substantially same level as the edge roll-off in the current status in which trichlorosilane is used as source gas.

In the method for producing an epitaxial wafer of the first invention, if the orientation dependence of epitaxial growth rate in the resulting wafer is reduced, an epitaxial wafer having excellent quality characteristics such as low haze level, excellent flatness, and reduced orientation dependence of growth rate (4FS) can be produced. To "reduce" the orientation dependence of growth rate means to reduce the orientation dependence of growth rate down below the current status thereof.

In the method for producing an epitaxial wafer of the first invention, the mixing ratio of trichlorosilane and dichlorosilane is set, by volume, in the proportion of 0.066 to 0.15 part of dichlorosilane to 1 part of trichlorosilane (in other words, within a range of "6 parts of trichlorosilane:0.4 part of dichlorosilane" to "4 parts of trichlorosilane:0.6 part of dichlorosilane"), whereby the haze level can be kept low and satisfactory flatness evaluated with edge roll-off can be maintained. The trichlorosilane used at that time is a gas of 22 to 28% concentration which is diluted with hydrogen, and dichlorosilane is a gas of 100% concentration.

In the method for producing an epitaxial wafer of the first invention, it is preferred that the temperature region of the epitaxial growth is set in the range of 1040 to 1080° C., the haze level of the resulting epitaxial wafer is controlled in the range of 0.050 to 0.080 ppm when measured in DWN mode by a KLA-Tencor particle counter (SP-1), and the flatness is improved so that the edge roll-off is within a range of −20 nm to +20 nm. According to this, an epitaxial wafer reduced in haze level and excellent in flatness can be produced.

The above-mentioned "edge roll-off" means an upward or downward "warpage" of an edge portion in the epitaxial wafer. Although the edge portion of a silicon wafer is apt to sag below the central portion, for example, by being polished much more than the center in polishing step or the like, the sagging of the edge portion tends to occur similarly in an epitaxial wafer having a silicon layer epitaxially grown on this wafer. Although this sagging is the downward warpage, the upward warpage can be caused depending on the conditions of the wafer polishing or epitaxial growth.

When the orientation dependence of epitaxial growth rate is evaluated with a film thickness of an epitaxial layer along an orientation of 45° relative to reference crystal orientation, given that a film thickness of the epitaxial layer along reference crystal orientation be taken as 1, it is preferable that, in the method for producing an epitaxial wafer of the first invention, the film thickness of the epitaxial layer along the orientation of 45° is controlled to be 0.985 or more, since an epitaxial wafer reduced in orientation dependence of growth rate can be produced, and the extent of this reduction in orientation dependence of growth rate also can be quantitatively evaluated.

In the method for producing an epitaxial wafer of the first invention, the growth rate in the epitaxial growth of the silicon layer is preferably set to be higher than 1.5 μm/min. According to this, the reduction of epitaxial growth rate due to the mixed use of dichlorosilane as source gas can be contained in a specific range.

(2) An epitaxial wafer, for which a mixed gas of trichlorosilane and dichlorosilane is used as source gas, and a silicon layer is epitaxially grown on a surface of a silicon wafer, wherein the wafer has a haze level being equivalent to that of a polished wafer, and is excellent in flatness.

It is preferred that the epitaxial wafer of the first invention is reduced also in the orientation dependence of the epitaxial growth rate. According to this, the epitaxial wafer can secure further excellent quality characteristics.

In the epitaxial wafer of the first invention, it is preferred that the haze level is 0.050 to 0.080 ppm when measured in DWN mode by a KLA-Tencor particle counter (SP-1), and the flatness is within a range of −20 nm to +20 nm in terms of edge roll-off. According to this, since the haze level is low, the epitaxial wafer is immune from interfering with the measurement of minute-size particles, and since the edge roll-off is kept low, the epitaxial wafer can secure an extended available area for device fabrication.

In the epitaxial wafer of the first invention, it is preferred that, when the orientation dependence of epitaxial growth rate is evaluated with a film thickness of anepitaxial layer along the orientation of 45° relative to reference crystal orientation, given that a film thickness of the epitaxial layer along reference crystal orientation be taken as 1, the film thickness of the epitaxial layer along the orientation of 45° is controlled to be 0.985 or more. According to this, the epitaxial wafer has a reduced haze level, flatness maintained at satisfactory level, and reduced orientation dependence of growth rate, and the extent of this reduction in orientation dependence also can be quantitatively evaluated.

Solution to Problem of "Second Invention"

Under the same idea as in the "first invention", haze levels of epitaxial wafers in case dichlorosilane was used as source gas, and which were obtained under various epitaxial growth temperatures over a wide range, were measured. As a result of the measurements, it was confirmed that, by using dichlorosilane, satisfactory haze level can be maintained without getting worse than that of a polished wafer (mirror-polished wafer).

It was also found that, on the high-temperature side across 1050° C., the temperature dependence of haze level is noticeable, and becomes higher with the temperature being higher, but on the other hand, when the growth temperature is 1050° C. or lower, the haze level shows a low value irrespective of the temperature.

With respect to the flatness evaluated with edge roll-off, also, it was confirmed that the flatness can be maintained in a low range equivalent to a current status (that is, when trichlorosilane is used). When dichlorosilane is used as source gas, the supply flow rate thereof seriously affects the edge roll-off, and the edge roll-off becomes larger with the flow rate being higher. However, the edge roll-off can be maintained in the low range by appropriately controlling the flow rate.

The second invention is achieved based on such finding, and the summary thereof lies in (3) a method, described below, for producing an epitaxial wafer and in (4) an epitaxial wafer, described below, which can be produced by this method.

(3) A method for producing an epitaxial wafer by epitaxially growing a silicon layer on a surface of a silicon wafer, includes: using dichlorosilane as source gas, epitaxially growing the silicon layer within a temperature range of 900 to 1150° C.; and preventing a haze level of the resulting epitaxial wafer from getting worse than that of polished wafer, and making the resulting epitaxial wafer excellent in flatness.

In the method for producing an epitaxial wafer of the second invention, the temperature range of the epitaxial growth is preferably set in the feed dominant territory. According to this, the epitaxial film thickness can be accurately controlled since the temperature dependence of epitaxial growth rate is low.

In the method for producing an epitaxial wafer of the second invention, it is preferred that the temperature region of the epitaxial growth is set in the range of 1000 to 1050° C., the haze level of the resulting epitaxial wafer is controlled in the range of 0.050 to 0.080 ppm when measured in DWN mode by a KLA-Tencor particle counter (SP-1), and the flatness is improved so that the edge roll-off is within a range of −14 nm to +14 nm. According to this, an epitaxial wafer reduced in haze level and excellent in flatness can be stably produced.

The above-mentioned "edge roll-off" means downward or upward "warpage" of edge portion in the epitaxial wafer, as similarly to the description for the first invention. Namely, the upward "warpage" can be caused depending on the conditions of the wafer polishing or epitaxial growth.

In the method for producing an epitaxial wafer of the second invention, if the silicon wafer is subjected to preannealing treatment prior to the epitaxial growth, degradation of the crystallinity of epitaxial growth layer (generation of crystal defects, polycrystallization, etc.) which is associated with the reduction in epitaxial growth temperature can be avoided. The preannealing treatment is preferably performed at a temperature higher than the epitaxial growth temperature.

(4) An epitaxial wafer, for which dichlorosilane is used as source gas, and in which a silicon layer is epitaxially grown on a surface of a silicon wafer, wherein the wafer has a haze level being equivalent to that of a polished wafer, and is excellent in flatness.

In the epitaxial wafer of the second invention, it is preferred that the haze level is in the range of 0.050 to 0.080 ppm when measured in DWN mode by a KLA-Tencor particle counter (SP-1), and the flatness is within a range of −14 nm to +14 nm in terms of edge roll-off. According to this, the epitaxial wafer is immune from interfering with the measurement of minute-size particles since the haze level is low, and can securely extend an available area for device fabrication since the edge roll-off is kept low.

Solution to Problem of "Third Invention"

Under the same idea as in the "first invention", the present inventor examined to use dichlorosilane as source gas in the epitaxial wafer production that epitaxially grows silicon on a silicon substrate by the CVD method.

As a result, it was found that the use of dichlorosilane as source gas leads to large reduction of the orientation dependence of growth rate. It is estimated that since the concentration (content) of Cl group in dichlorosilane is differed from that in trichlorosilane, the balance between epitaxial growth reaction and reducing reaction (or decomposing reaction) varies by use of the dichlorosilane, and the orientation dependence of growth rate is reduced accordingly The reduction was about 0.5% in terms of gap intensity. This corresponds to one fourth of the current status (about 2%).

It was also confirmed that the flatness evaluated with edge roll-off can be kept in a low range equivalent to that in the current status (namely, when trichlorosilane is used) or lower than it. When dichlorosilane is used as source gas, the supply flow rate thereof seriously affects the flatness, and the edge roll-off becomes larger with the flow rate being higher. However, the edge roll-off can be kept low by appropriately controlling the flow rate. The edge roll-off referred to herein is a value obtained by measuring the thickness of the epitaxial film by Fourier transform infrared spectroscopy (FTIR method), as similarly in the description for the "first invention".

The third invention is achieved based on such finding, and the summary thereof lies in (5) a method, described below, for producing an epitaxial wafer and in (6) an epitaxial wafer, described below, which can be produced by this method.

(5) A method for producing an epitaxial wafer by epitaxially growing a silicon layer on a surface of a silicon wafer, including: using dichlorosilane as source gas, and epitaxially growing the silicon layer within a temperature range of 900 to 1150° C.; and reducing orientation dependence of epitaxial growth rate in the resulting wafer.

The "orientation dependence of epitaxial growth rate" referred to herein means that the epitaxial growth rate on the wafer surface varies depending on the crystal orientation of the wafer, and when <011> crystal orientation is taken as reference (0°), the thickness of the epitaxial film is increased along orientations of 90°, 180°, 270° and 360° (namely, 0°) due to high growth rate therein. Hereinafter, this is referred also to as "4FS (4-Fold Symmetry)" for short.

In the third invention, to "reduce" the orientation dependence of growth rate means to reduce it down below the orientation dependence of growth rate when trichlorosilane is used as source gas.

When the orientation dependence of epitaxial growth rate is evaluated with a film thickness of the epitaxial layer along the orientation of 45° relative to reference crystal orientation, given that a film thickness of the epitaxial layer along reference crystal orientation be taken as 1, if, in the method for producing an epitaxial wafer of the third invention, the film thickness of the epitaxial layer along the orientation of 45° is controlled to be 0.985 or more, the orientation dependence of growth rate can be reduced, and the extent of this reduction also can be quantitatively evaluated.

In the method for producing an epitaxial wafer of the third invention, it is preferred that the epitaxial growth temperature range is set in the range of 1000 to 1150° C., and the flatness evaluated with edge roll-off of the resulting epitaxial wafer is made substantially equivalent to or more excellent than that in the current status. According to this, the epitaxial growth can be performed in the feed dominant temperature territory in which the film thickness of epitaxial layer can be easily controlled due to low temperature dependence, and the edge roll-off can be kept extremely low.

In this case, the edge roll-off can be maintained in the range of −14 nm to +14 nm. This is preferred since the available area for device fabrication can be extended to improve the device fabrication yield.

The above-mentioned "edge roll-off" is one of indicators of the flatness of the wafer, and means downward or upward "warpage" of edge portion in the epitaxial wafer, similarly to the description for the first and second inventions.

In the method for producing an epitaxial wafer of the third invention, if the silicon wafer is subjected to preannealing treatment prior to the epitaxial growth, degradation of the crystallinity of epitaxial growth layer (generation of detects, polycrystallization, etc.) which is associated with the reduction in epitaxial growth temperature can be avoided. This preannealing treatment is preferably performed at a temperature higher than the epitaxial growth temperature.

(6) An epitaxial wafer in case dichlorosilane is used as source gas, and in which a silicon layer is epitaxially grown on a surface of a silicon wafer, wherein the wafer is reduced in orientation dependence of growth rate.

When the orientation dependence of epitaxial growth rate of the wafer is evaluated with a film thickness of an epitaxial layer along an orientation of 45° relative to reference crystal orientation, given that a film thickness of the epitaxial layer along reference crystal orientation be taken as 1, the epitaxial wafer of the third invention in which the film thickness of the epitaxial layer along the orientation of 45° is controlled to be 0.985 or more can be considered to have a reduced orientation dependence of growth rate.

In the epitaxial wafer of the third invention, if the flatness of the epitaxial wafer is within a range of −14 nm to +14 nm in terms of edge roll-off, the epitaxial wafer is preferable since it can be made excellent in flatness expressed by edge roll-off as well as in orientation dependence of growth rate.

Advantageous Effects of Invention

Advantageous Effects of "First Invention"

According to the method for producing an epitaxial wafer of a first invention (including embodiments), the epitaxial growth temperature can be reduced down below that in case trichlorosilane is used, and thus the haze level can be made low, and an epitaxial wafer, in which edge roll-off is kept low and flatness is excellent, or an epitaxial wafer, in which orientation dependence of growth rate is reduced in addition to the above advantageous effects, can be produced. The reduction of epitaxial growth rate, which results from the use of dichlorosilane, can be contained in a specific range, and the production efficiency of epitaxial wafer can be maintained relatively satisfactory level.

The epitaxial wafer of the first invention (including embodiments) is low in haze level, immune from interfering with the measurement of minute-size particles, and thus can be used as a high-quality wafer capable of responding to highly-integrated semiconductor devices.

The epitaxial wafer of the first invention can assure the overall flatness of the wafer with an extended assurance area of flatness on the wafer surface and thus secure a satisfactory device fabrication yield, since the edge roll-off is kept low, and the orientation dependence of growth rate (4FS), which is apt to occur in the outer peripheral area of the epitaxial wafer, is significantly reduced.

Advantageous Effects of "Second Invention"

In the method for producing an epitaxial wafer of the second invention (including embodiments), dichlorosilane is used as source gas, and epitaxial growth temperature and quality characteristics of the resulting epitaxial wafer (haze level and flatness evaluated with edge roll-off) are specified.

According to this method, since the epitaxial growth temperature can be reduced down below that in case trichlorosilane is used, the haze level can be made low, and an epitaxial wafer, in which edge roll-off is kept low by appropriately controlling the flow rate of dichlorosilane and the like, and flatness is excellent, can be produced. Moreover, effects of improvement in productivity and reduction in power consumption in associated equipment such as a CVD reactor can be also obtained by shortening time for rising/lowering temperature in association with the epitaxial growth at a lower temperature.

The epitaxial wafer of the second invention (including embodiments) is low in haze level, immune from interfering with the measurement of minute-size particles, and thus can be used as a high-quality wafer capable of responding to highly-integrated semiconductor devices. Further, the epitaxial wafer can have an extended available area for device fabrication and thus secure a satisfactory device fabrication yield since the edge roll-off is kept low.

Advantageous Effects of "Third Invention"

In the method for producing an epitaxial wafer of the third invention (including embodiments), dichlorosilane is used as source gas, and the epitaxial growth temperature and quality characteristics of the resulting epitaxial wafer (orientation dependence of growth rate, desirably, flatness evaluated with edge roll-off) are specified.

According to the method of the third invention, the orientation dependence of growth rate (4FS) is significantly reduced, and an epitaxial wafer, in which edge roll-off is kept low by appropriately controlling the supply flow rate of dichlorosilane and the like, and thus flatness is excellent, can be produced. Effects of improvement in productivity and reduction in power consumption in associated equipment such as a CVD reactor can be also obtained by shortening time for temperature-rising/lowering associated with the epitaxial growth at a lower temperature.

The epitaxial wafer of the third invention (including embodiments) can assure the overall flatness of the wafer with an extended assurance area of flatness on the wafer surface and thus secure a satisfactory device fabrication yield, since the orientation dependence of growth rate (4FS), which is apt to occur particularly in the outer peripheral area of the epitaxial wafer, is significantly reduced, and the edge roll-off can be also kept low.

DESCRIPTION OF EMBODIMENTS

A "First Invention" and Embodiments Thereof

The method for producing an epitaxial wafer of the first invention by epitaxially growing a silicon layer on a surface of a silicon wafer includes: using a mixed gas of trichlorosilane and dichlorosilane as source gas, and epitaxially growing the silicon layer within a temperature range of 1000 to 1100° C., and preventing the haze level of the resulting epitaxial wafer from getting worse than that of a polished wafer, and making the resulting epitaxial wafer excellent in flatness.

The epitaxial growth of the silicon layer on the surface of the silicon wafer can be performed by applying the conventionally-used CVD method.

One reason for using, in the method for producing an epitaxial wafer of the first invention, the mixed gas of trichlorosilane and dichlorosilane as source gas is that, by mixing dichlorosilane, the temperature of the epitaxial growth temperature region is reduced down below that in case trichlorosilane is solely used, while the haze level is reduced thereby. The other reason is that the extent of the reduction of epitaxial growth rate in comparison with that in case only dichlorosilane is used is relaxed to maintain the production efficiency at a relatively satisfactory level.

Figure 1:
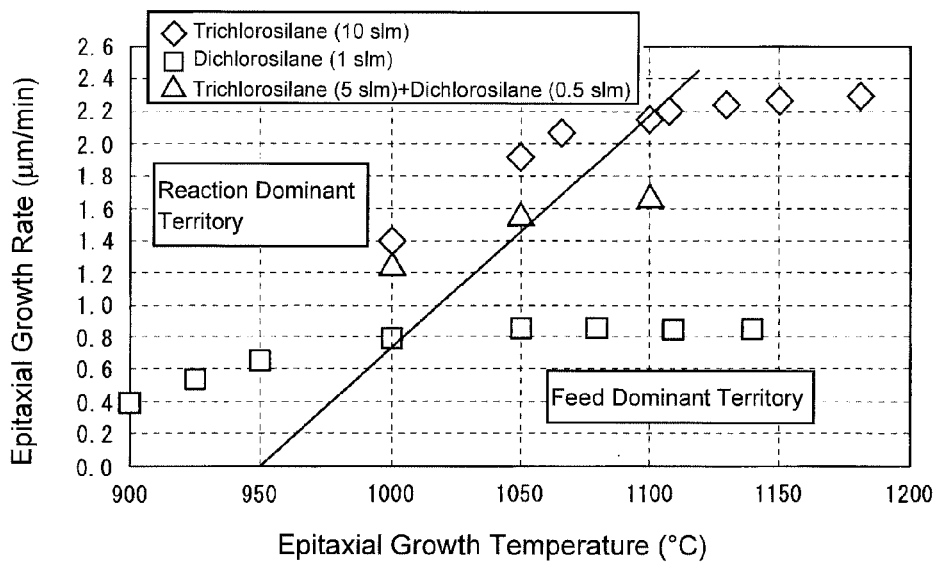
FIG. 1 is a view showing effect of kinds of source gases on relationship between epitaxial growth rate and epitaxial growth temperature by the CVD method.

FIG. 1 is a view showing the effect of kinds of source gases on the relationship between epitaxial growth rate and epitaxial growth temperature by the CVD method. This figure graphically illustrates epitaxial growth rates of wafers of 300 mm in diameter, the growth rates obtained under the condition that trichlorosilane (source gas flow rate to CVD reactor: 10 slm), dichlorosilane (flow rate: 1 slm), and a mixed gas of trichlorosilane and dichlorosilane (flow rate: trichlorosilane 5 slm, dichlorosilane 0.5 slm) were used as source gases, and epitaxial growth temperatures were set to predetermined temperatures.

The unit "slm" of the source gas flow rate represents standard liter/min, namely, a flow rate (litter) per minute under 1 atmospheric pressure and 0° C.

As shown in FIG. 1, the comparison of epitaxial growth rates in a feed dominant temperature territory, which is generally used for epitaxial growth, shows that the growth rate is about 0.85 µm/min when only dichlorosilane is used as source gas; however, the growth rate can be enhanced to about 1.6 µm/min by using a mixed gas of trichlorosilane and dichlorosilane, and production efficiency can be maintained at a relatively high level.

The lower limit temperature of the feed dominant temperature territory is about 1100° C. when trichlorosilane is used as source gas; however, the temperature is about 1040° C. when a mixed gas of trichlorosilane and dichlorosilane is used. This fact shows that the temperature of the epitaxial growth temperature region can be made lower than a case in which only trichlorosilane is used.

The reason for specifying the epitaxial growth temperature to be within the temperature range of 1000 to 1100° C. in the method for producing an epitaxial wafer of the first invention is that the haze level of the resulting epitaxial wafer can be maintained in a low level without getting worse than that of a polished wafer. When the epitaxial growth temperature is below 1000° C., the epitaxial growth rate is reduced, and the edge roll-off is deteriorated. On the other hand, when the growth temperature exceeds 1100° C., the haze level is worsened.

As described above, by using a mixed gas of trichlorosilane and dichlorosilane as source gas, the temperature of the epitaxial growth temperature region can be made lower than a case where trichlorosilane is used, and the haze level is reduced. However, even if the above-mentioned mixed gas is used and the epitaxial growth is performed in the predetermined temperature range, the above-mentioned worsening tendency of haze level is observed in a high-temperature side region at or near 1100° C.

Since a low-temperature region at or near 1000° C. belongs to the reaction dominant territory, the temperature dependence of epitaxial growth rate is high, the accuracy of epitaxial film thickness control is deteriorated, and the edge roll-off tends to deteriorate. Thus, in actual operation, it is preferred to select a temperature range, where the haze level is stably kept low, and perform the epitaxial growth therein.

In the method for producing an epitaxial wafer of the first invention, there are specified that a haze level of a resulting epitaxial wafer is prevented from getting worse than that of a polished wafer, and the resulting epitaxial wafer is made excellent in flatness, in addition to specifying the epitaxial growth temperature. Namely, the quality characteristics of the resulting epitaxial wafer are specified.

The haze level must be prevented from getting worse than that of a polished wafer, which can be ensured by performing the epitaxial growth within the above-mentioned predetermined temperature range while considering the operation aspect. On the other hand, the excellent flatness can be ensured by appropriately controlling the flow rate of the dichlorosilane used as source gas while performing the epitaxial growth within the above-mentioned predetermined temperature range.

In the method for producing an epitaxial wafer of the first invention, it is preferred to further reduce the orientation dependence of epitaxial growth rate in the resulting wafer. As described above, this can be ensured by using a mixed gas of trichlorosilane and dichlorosilane as source gas, and performing the epitaxial growth within the temperature range of 1000 to 1100° C.

According to this, an epitaxial wafer with excellent quality characteristics such as low haze level, excellent flatness, and reduced orientation dependence of growth rate (4FS) can be produced. However, when the proportion of trichlorosilane in the mixed gas of trichlorosilane and dichlorosilane used as source gas becomes higher, the orientation dependence of epitaxial growth rate tends to aggravate, resulting in increased gap intensity. Thus, in actual operation, it is desirable to consider the proportion of trichlorosilane in the mixed gas where necessary, use the mixed gas having an appropriate proportion and perform the epitaxial growth.

In the method for producing an epitaxial wafer of the first invention (including embodiments), the mixing ratio of trichlorosilane and dichlorosilane is preferably set, by volume, in the proportion of 0.066 to 0.15 part of dichlorosilane to 1 part of trichlorosilane. To put it practically, the mixing ratio is in the proportion of "6 parts of trichlorosilane:0.4 part of dichlorosilane" to "4 parts of trichlorosilane:0.06 part of dichlorosilane".

Since the feed dominant temperature territory is allowed to exist in a temperature region lower than 1050° C. by setting the mixing ratio of trichlorosilane and dichlorosilane to the above-mentioned range, the haze level is kept low and satisfactory flatness evaluated with edge roll-off can be maintained. Further, the orientation dependence of growth rate (4FS) can be minimized to reduce the gap intensity.

A more preferable mixing ratio (volume ratio) of trichlorosilane and dichlorosilane is 0.10 to 0.15 part of dichlorosilane to 1 part of trichlorosilane (within a range of "5 parts of trichlorosilane:0.5 part of dichlorosilane" to "4 parts of trichlorosilane:0.6 part of dichlorosilane"). According to this, the haze level, the flatness evaluated with edge roll-off, and the orientation dependence of growth rate (4FS) can be more stably maintained at satisfactory levels.

In the method for producing an epitaxial wafer of the first invention (including embodiments), it is preferable that the temperature range of the epitaxial growth is set in the feed dominant territory, since the deterioration tendency of edge roll-off can be suppressed, and further the temperature dependence of epitaxial growth rate can be reduced, and thus the control of epitaxial film thickness is accurately performed.

In the method for producing an epitaxial wafer of the first invention (including embodiments), if the temperature region of the epitaxial growth is set in the range of 1040 to 1080° C., the haze level of the resulting epitaxial wafer is controlled in the range of 0.050 to 0.080 ppm when measured in DWN mode by a KLA-Tencor particle counter (SP-1), and the flatness is improved so that the edge roll-off is within a range of −20 nm to +20 nm, an epitaxial wafer reduced in haze level and excellent in flatness can be stably produced.

The reason for setting the preferable temperature region of the epitaxial growth in the range of 1040 to 1080° C. is that the haze level is reduced and the growth temperature can be limited in the feed dominant territory suitable for the epitaxial growth.

Since epitaxial growth temperatures below 1040° C. belong to the reaction dominant territory, the temperature dependence of epitaxial growth rate is high, the accuracy of film thickness control is deteriorated, and the edge roll-off tends to deteriorate. On the other hand, when the growth temperature exceeds 1080° C., the haze level tends to increase, as shown below.

Figure 2:
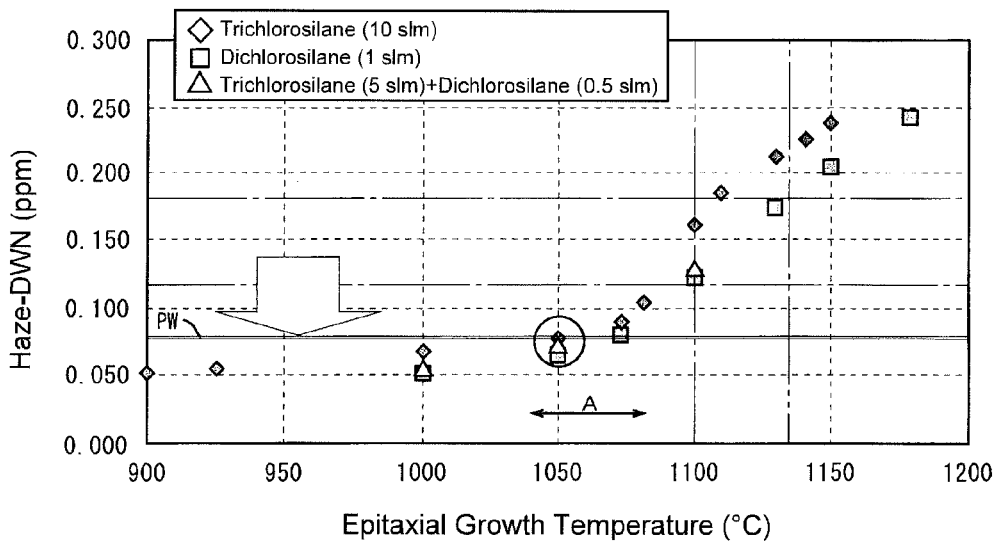
FIG. 2 is a view showing relationship between epitaxial growth temperature by the CVD method and haze level.

FIG. 2 is a view illustrating a relationship between the epitaxial growth temperature by the CVD method and the haze level. This figure graphically illustrates, haze levels of epitaxial wafers of 300 mm in diameter, the haze levels obtained by using trichlorosilane (source gas flow rate: 10 slm), dichlorosilane (flow rate: 1 slm) and a mixed gas of trichlorosilane and dichlorosilane (flow rate: trichlorosilane 5 slm, dichlorosilane 0.5 slm), and setting epitaxial growth temperatures to predetermined temperatures. The haze levels are shown as the above-mentioned values measured in DWN mode.

In FIG. 2, the temperature region sandwiched by long dashed double-dotted lines (1100 to 1130° C.) is a conventional epitaxial growth temperature region when trichlorosilane is used as source gas. The haze level in this case is within the range sandwiched by dashed-dotted lines (about 0.12 to 0.18 ppm as the value measured in DWN mode) as shown in the figure.

As is apparent from FIG. 2, the temperature dependence of haze level is noticeable on the high-temperature side across 1050° C., particularly beyond 1080° C., irrespective of kinds of source gases, and the haze level becomes higher with the temperature being higher.

In addition, at the same temperature, the haze level is higher when trichlorosilane is used as source gas. As is apparent from the haze level value when the epitaxial growth temperature is 1100° C., however, the use of a mixed gas of trichlorosilane and dichlorosilane reduces the haze level to the same degree as the case dichlorosilane is solely used. This is an effect which is never observed when only trichlorosilane is used as source gas.

In one embodiment of the method for producing an epitaxial wafer of the first invention, preferable ranges of quality characteristics of the resulting epitaxial wafer are concretely specified. Namely, the haze level is controlled in the range of 0.050 to 0.080 ppm as the value measured in DWN mode, and the edge roll-off is set in the range of −20 nm and +20 nm.

The temperature range indicated by an arrow with reference sign A in FIG. 2 is the above-mentioned preferable temperature range of epitaxial growth (1040 to 1080° C.). In the method for producing an epitaxial wafer of the first invention, by setting the temperature range of epitaxial growth in the range of 1040 to 1080° C., the haze level can be, as indicated by the outlined arrow, reduced from the range sandwiched by dashed-dotted lines (about 0.12 to 0.18 ppm as the value measured in DWN mode) to the level indicated by a double line with reference sign PW (0.080 ppm as the value measured in DWN mode) or less, more accurately, to a range of 0.050 to 0.080 ppm as the value measured in DWN mode.

This corresponds to the haze level of a polished wafer. The reason for specifying the haze level to this range is that a haze level higher than this range interferes with the measurement of minute-size particles on the epitaxial wafer surface. Further, the reduction of the haze level is needed for use in a substrate for highly-integrated semiconductor devices.

The reason for improving the flatness so that the edge roll-off is within the range of −20 nm to +20 nm is that the edge roll-off is maintained in a low range equivalent to the edge roll-off in the current status. This is because the edge roll-off in the current status is substantially within this range of −20 nm to +20 nm when the mixed gas of trichlorosilane and dichlorosilane is used as source gas, and the epitaxial growth temperature is controlled so as to belong to the feed dominant territory suitable for epitaxial growth.

As is apparent from FIG. 2, in the above-mentioned preferable temperature region (1040 to 1080° C.), the temperature region at and around 1050° C. surrounded by a circle in the figure is more preferred.

When the orientation dependence of epitaxial growth rate is evaluated with a film thickness of an epitaxial layer along the orientation of 45° relative to reference crystal orientation, given that a film thickness of the epitaxial layer along reference crystal orientation be 1, it is preferred to make a relative film thickness of the epitaxial layer along the orientation of 45° is 0.985 or more in the above-mentioned embodiment of the method for producing an epitaxial wafer of the first invention.

Although the orientation dependence of growth rate in the current state is represented by a relative epitaxial film thickness of about 0.980, an epitaxial wafer which is reduced in orientation dependence of growth rate while achieving low haze level and satisfactory flatness can be produced by adopting this embodiment. Furthermore, the extent of the reduction in orientation dependence of growth rate can be objectively and quantitatively evaluated.

In the method for producing an epitaxial wafer of the first invention (including embodiments), the growth rate in the epitaxial growth of the silicon layer is preferably set to be larger than 1.5 μm/min.

As shown in the above-mentioned FIG. 1, by using a mixed gas of trichlorosilane and dichlorosilane as source gas, the epitaxial growth rate is reduced, compared with the conventional case where only trichlorosilane is used. By specifying the above-mentioned preferable growth rate, however, the reduction of epitaxial growth rate can be suppressed and contained in a specific range, and production efficiency can be maintained at a relatively satisfactory level.

In the method for producing an epitaxial wafer of the first invention (including embodiments), the silicon wafer is preferably subjected to preannealing (hydrogen gas baking) treatment prior to the epitaxial growth. In accordance with the reduction in epitaxial growth temperature, for example, generation of defects counted as LPD (Light Point Defect) or the like and polycrystallization tend to occur.

By performing the preannealing treatment, such degradation of the crystallinity of the epitaxial growth layer (generation of defects or the like, polycrystallization) can be avoided. The preannealing treatment is preferably performed at a temperature higher than the epitaxial growth temperature.

As has been described so far, according to the method for producing an epitaxial wafer of the first invention (including embodiments), an epitaxial wafer which is low in haze level, has edge roll-off being kept low, and is excellent in flatness, and or an epitaxial wafer which is furthermore reduced in orientation dependence of growth rate can be produced in addition to the above advantage effects. The production efficiency of the epitaxial wafer can be kept relatively high while suppressing the reduction of epitaxial growth rate which results from the use of dichlorosilane.

As described above, the epitaxial wafer of the first invention is an epitaxial wafer in case a mixed gas of trichlorosilane and dichlorosilane is used as source gas, and a silicon layer is epitaxially grown on a surface of a silicon wafer, wherein the wafer has a haze level being equivalent to that of a polished wafer, and is excellent in flatness.

Further, it is preferred if the epitaxial wafer of the first invention is reduced in the orientation dependence of epitaxial growth rate, the epitaxial wafer becomes more excellent in quality characteristics.

In a more preferable embodiment of the epitaxial wafer of the first invention, the epitaxial wafer of the first invention (including embodiments) has a haze level of 0.050 to 0.080 ppm in the above-mentioned DWN mode, and flatness within a range of −20 nm to +20 nm in terms of edge roll-off Namely, preferable ranges of quality characteristics of the epitaxial wafer are concretely specified.

When the orientation dependence of epitaxial growth rate in a wafer is evaluated with a film thickness of an epitaxial layer along the orientation of 45° relative to reference crystal orientation, given that a film thickness of the epitaxial layer in the reference crystal orientation be taken as 1, it is more preferred that, in one embodiment of the epitaxial wafer of this first invention, a film thickness of an epitaxial layer along the orientation of 45° is 0.985 or more.

Namely, the epitaxial wafer of the first invention (including embodiments) is a wafer including an epitaxial layer obtained by using a mixed gas of trichlorosilane and dichlorosilane as source gas, and features quality characteristics, which an epitaxial wafer is expected to have, and which are specified by the method for producing an epitaxial wafer of the first invention. Therefore, the epitaxial wafer of the first invention can be obtained by applying, for example, the above-mentioned method for producing an epitaxial wafer of the first invention.

The epitaxial wafer of the first invention (including embodiments) is immune from interfering with the measurement of minute-size particles since the haze level is low as described above, and thus can be used as a high-quality wafer capable of corresponding to highly-integrated semiconductor devices.

Since the epitaxial wafer of the first invention has an edge roll-off that is kept low, and a significantly reduced orientation dependence of growth rate (4FS), which tends to occur in the outer peripheral area of the epitaxial wafer, an area where the flatness is assured is extended on a wafer surface, the flatness over the whole surface of wafer is assured, and thus a satisfactory device fabrication yield is secured. The epitaxial wafer of the first invention can be produced by the above-mentioned method of the first invention.

A "Second Invention" and Embodiments Thereof

The method for producing an epitaxial wafer of the second invention by epitaxially growing a silicon layer on a surface of a silicon wafer as described above includes: using dichlorosilane as source gas, and epitaxially growing the silicon layer within a temperature range of 900 to 1150° C.; and preventing the haze level of the resulting epitaxial wafer from getting worse than the haze level of polished wafer, and making the resulting epitaxial wafer excellent in flatness.

The reason for using, in the method for producing an epitaxial wafer of the second invention, dichlorosilane as source gas is that dichlorosilane is decomposed at a lower temperature than trichlorosilane, and can make the temperature of the epitaxial growth temperature region lower than a case where trichlorosilane is used, and the haze level can be reduced owing to this reduction in temperature.

The epitaxial growth of the silicon layer on the surface of the silicon wafer can be performed by applying the conventionally-used CVD method.

In the method for producing an epitaxial wafer of the second invention, the reason for specifying the epitaxial growth temperature in the range of 900 to 1150° C. is that the haze level of the resulting epitaxial wafer is prevented from getting worse than the haze level of polished wafer and can be kept in a low level.

The epitaxial growth temperature below 900° C. interferes with the progression of thermal decomposition or reducing reaction of dichlorosilane that is source gas, and smooth epitaxial growth is prevented. On the other hand, when the growth temperature exceeds 1150° C., the haze level is worsened.

By using dichlorosilane as source gas, the temperature of the epitaxial growth temperature region can be lower than a case where trichlorosilane is used, and the haze level is reduced. In spite of the use of dichlorosilane, however, the haze level tends to worsen in a high-temperature region of 1080° C. or higher.

On the other hand, at 950° C. or lower, the haze level is maintained in a low level where it does not become worse than the haze level of a polished wafer. However, since the temperature belongs to the reaction dominant territory, the temperature dependence of epitaxial growth rate is large, and the accuracy of film thickness control is deteriorated. Therefore, it is desirable in actual operation to select a temperature region where the haze level can be stably kept low and to perform the epitaxial growth.

In the method for producing an epitaxial wafer of the second invention, it is further specified that the haze level of the resulting epitaxial wafer is prevented from getting worse than that of a polished wafer, and the resulting epitaxial wafer is made excellent in flatness. Namely, quality characteristics of the resulting epitaxial wafer are specified.

The control of the haze level is that the haze level is prevented from getting worse than the haze level of polished wafer, and this can be secured by performing the epitaxial growth within the above-mentioned predetermined temperature range while considering operation aspect as described above. On the other hand, the excellent flatness of the polished wafer can be secured by appropriately controlling the flow rate (the supply rate to CVD reactor) of the dichlorosilane used as source gas while performing the epitaxial growth within the above-mentioned predetermined temperature range (details will be described later).

The above-mentioned "excellent flatness" means that the edge roll-off, with which the flatness is to be evaluated, is maintained in the same level as in the current status. This will be also described in detail in the description for embodiments of the method of the second invention.

In the method for producing an epitaxial wafer of the second invention, the temperature region of the epitaxial growth is preferably set in the feed dominant territory. According to this, the temperature dependence of epitaxial growth rate can be reduced, and the control of epitaxial film thickness can be accurately performed.

When dichlorosilane is used as source gas, the feed dominant territory generally corresponds to a temperature range of about 1000 to 1150° C. By setting the temperature region of the epitaxial growth to this temperature range, the edge roll-off can be maintained in a low range equivalent to that in the current status (namely, when trichlorosilane is used), and the flatness can be further improved, as shown in embodiments below. Also in this case, since the haze level tends to worsen at 1080° C. or higher, it is preferred to select a temperature range where the haze level can be kept low as described above, and to perform the epitaxial growth.

In the method for producing an epitaxial wafer of the second invention, preferably, the temperature region of the epitaxial growth is set in the range of 1000 to 1050° C., the haze level of the resulting epitaxial wafer is made to 0.050 to 0.080 ppm, which is measured in DWN mode by a KLA-Tencor particle counter (SP-1), and the flatness is improved so that the edge roll-off is within a range of −14 nm to +14 nm.

According to this, an epitaxial wafer which is reduced in haze level and excellent in flatness can be stably produced.

The reason for setting the preferable temperature region of the epitaxial growth in the range of 1000 to 1050° C. is that the haze level is reduced and the growth temperature is limited in the feed dominant territory suitable for epitaxial growth. At an epitaxial growth temperature below 1000° C. which belongs to the reaction dominant territory, the accuracy of film thickness control is deteriorated due to the heavy temperature dependence of epitaxial growth rate. On the other hand, when the growth temperature exceeds 1050° C., the haze level tends to increase as shown below.

Figure 3:
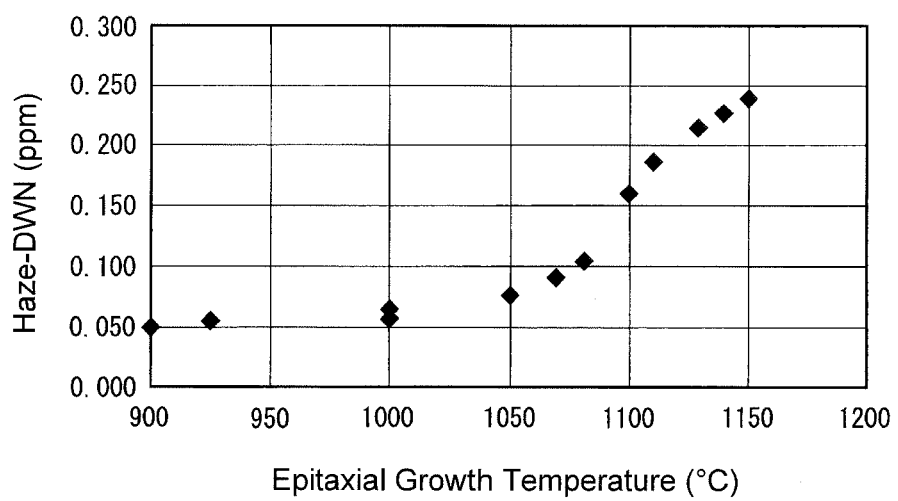
FIG. 3 is a view showing relationship between haze level and epitaxial growth temperature when dichlorosilane is used as source gas for epitaxial growth by the CVD method.

FIG. 3 graphically illustrates results obtained in examples, which will be described later, and shows a relationship between epitaxial growth temperature and haze level when dichlorosilane is used as source gas for epitaxial growth by the CVD method. The haze level is indicated by the above-mentioned value measured in DWN mode.

As is apparent from FIG. 3, since the temperature dependence of haze level is noticeable on the high-temperature side across 1050° C., and the haze level becomes higher with the temperature being higher, a preferred upper limit of the epitaxial growth temperature is set to 1050° C. On the other hand, a low haze level is shown at 1050° C. or lower, irrespective of the temperature. However, since an epitaxial growth temperature lower than 1000° C. belongs to the reaction dominant territory, a desirable lower limit is set to 1000° C. When the epitaxial growth temperature is within the temperature range of 1000 to 1050° C., the haze level can be controlled in the range of 0.050 to 0.080 ppm.

In one embodiment of the method for producing an epitaxial wafer of the second invention, preferable quality characteristics of the resulting epitaxial wafer, namely, preferable ranges of the haze level and the edge roll-off in an epitaxial wafer which is produced by using dichlorosilane as source gas and setting the epitaxial growth temperature within the preferable range of 1000 to 1050° C. are concretely defined.

The haze level measured in the above-mentioned DWN mode is set to 0.050 to 0.080 ppm. This corresponds to the haze level of polished wafer. The reason for specifying the haze level to this range is that, when the haze level is high beyond this range, the haze level becomes noise component in the measurement of particles on the epitaxial wafer surface, and interferes with measuring minute-size particles. In addition, the reduction of the haze level is needed for use in a substrate for highly-integrated semiconductor devices.

The edge roll-off is set in the range of −14 nm to +14 nm. This corresponds to the range of edge roll-off in a case in which trichlorosilane is used as source gas and the epitaxial growth temperature is controlled to be within the feed dominant territory suitable for epitaxial growth. Namely, the edge roll-off is specified so as to be maintained in a low range equivalent to this edge roll-off in the current status.

Figure 4:
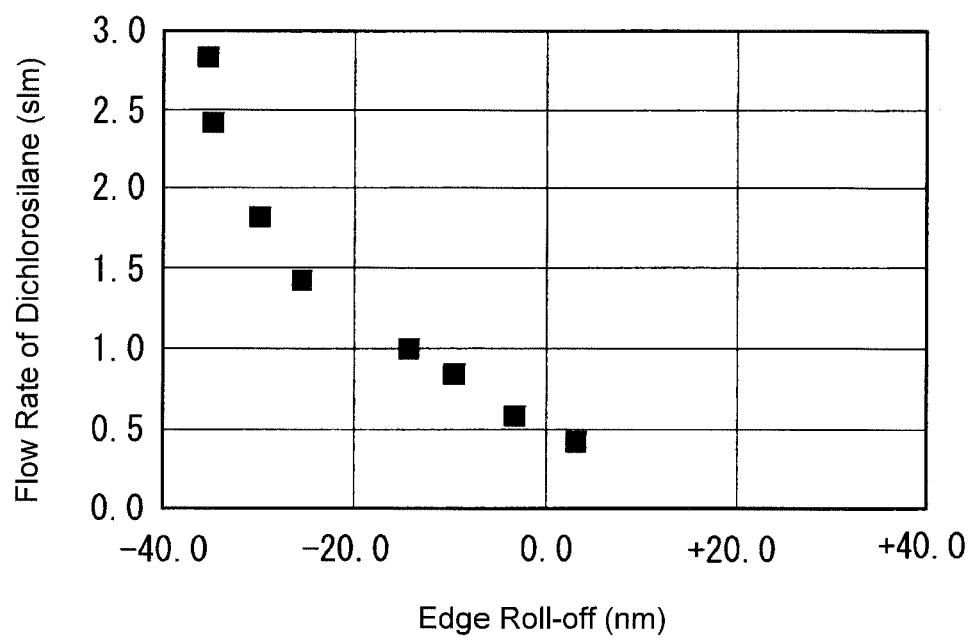
FIG. 4 is a view showing relationship between edge roll-off and source gas flow rate when dichlorosilane is used as source gas for epitaxial growth by the CVD method.

FIG. 4 is a view showing a relationship between the source gas flow rate when dichlorosilane is used as source gas for epitaxial growth by the CVD method and the edge roll-off. This drawing indicates an examination result about the effect of flow rate of dichlorosilane on the edge roll-off, under the conditions that an epitaxial growth temperature was 1000° C., and the flow rate of dichlorosilane was varied within a range of 0.4 to 2.8 slm.

In FIG. 4, a negative prefix "−" for the edge roll-off on the horizontal axis represent downward warpage of edge portion (sagging of edge portion) in the epitaxial wafer, while a positive prefix "+" therefor being upward warpage thereof.

It is found from FIG. 4 that the edge roll-off can be maintained in the range of −14 nm to +14 nm by setting the flow rate of dichlorosilane to 1.2 or less under the conditions that the epitaxial growth temperature is 1000° C. and the flow rate of carrier gas is appropriately adjusted within a range of 40 to 80 slm.

In the method for producing an epitaxial wafer of the second invention (including embodiments), the silicon wafer is preferably subjected to preannealing (baking) treatment prior to the epitaxial growth. For example, the defects counted as LPD (Light Point Defect) or the like are increased, according as the epitaxial growth temperature is reduced.

Although polycrystallization also tends to occur by the reduction of growth temperature, such deterioration of the crystallinity of epitaxial growth layer can be avoided by performing the preannealing treatment. In the present invention, since the temperature of the epitaxial growth temperature region is reduced by using the dichlorosilane as source gas, the preannealing treatment is particularly effective.

This preannealing treatment is preferably performed at a temperature higher than the epitaxial growth temperature. Concretely, when the epitaxial growth temperature is 1050° C., a satisfactory result can be obtained by performing the preannealing treatment in carrier gas ($H_2$) atmosphere at 1080° C. for 30 seconds. Also in a fabrication test of epitaxial wafer, the test performed to obtain the above-mentioned result shown in FIG. 1, the preannealing treatment was performed at 1080° C. when the epitaxial growth temperature was 1050° C.

As has been described so far, according to the method for producing an epitaxial wafer of the second invention (including embodiments), dichlorosilane is used as source gas, a silicon layer is epitaxially grown on a surface of a silicon wafer at a predetermined temperature (900 to 1150° C., preferably in the feed dominant territory in case of dichlorosilane, more preferably 1000 to 1050° C.), the resulting epitaxial wafer achieves predetermined quality characteristics (preferably, a haze level of 0.050 to 0.080 ppm in the above-mentioned DWN mode, and edge roll-off within the range of −14 nm to +14 nm).

Namely, the epitaxial growth temperature is reduced by using the dichlorosilane, whereby the haze level can be reduced to the extent of the haze level in mirror-polished wafer, and the edge roll-off can be kept in a low range equivalent to the edge roll-off in the current status by adjusting the source gas flow rate or the like.

As described above, the epitaxial wafer of the second invention is an epitaxial wafer in case dichlorosilane is used as source gas, and a silicon layer is epitaxially grown on a surface of a silicon wafer, wherein the wafer has a haze level being equivalent to a haze level of polished wafer, and is excellent in flatness.

In a preferred embodiment of the epitaxial wafer of the second invention, the epitaxial wafer of the second invention has a haze level of 0.050 to 0.080 ppm in the above-mentioned measurement in DWN mode, and flatness within a range of −14 nm to +14 nm in terms of edge roll-off.

Namely, the epitaxial wafer of the second invention (including embodiments) is a wafer including an epitaxial layer obtained by using dichlorosilane as source gas, and features quality characteristics which the method for producing an epitaxial wafer of the second invention provides and the epitaxial wafer is expected to have. Accordingly, the epitaxial wafer of the second invention can be obtained, for example, by applying the above-mentioned method for producing an epitaxial wafer of the second invention.

The epitaxial wafer of the second invention is immune from interfering with measuring minute-size particles since its haze level is low as described above, and can be suitably used as a substrate material for highly-integrated semiconductor devices. Further, since the epitaxial wafer of the second invention has an edge roll-off that is maintained low to the substantially same extent as the current status, it has a wide available area for the fabrication of devices and can secure a satisfactory device fabrication yield.

A "Third Invention" and Embodiments Thereof

A method for producing an epitaxial wafer of the third invention by epitaxially growing a silicon layer on a surface of a silicon wafer as described above, includes: using dichlorosilane as source gas, and epitaxially growing the silicon layer within a temperature range of 900 to 1150° C.; and reducing orientation dependence of growth rate in the resulting epitaxial wafer.

In the method for producing an epitaxial wafer of the third invention, the reason for using the dichlorosilane as source gas is that the orientation dependence of growth rate can be significantly reduced, compared with a case where trichlorosilane is used.

Figure 5:
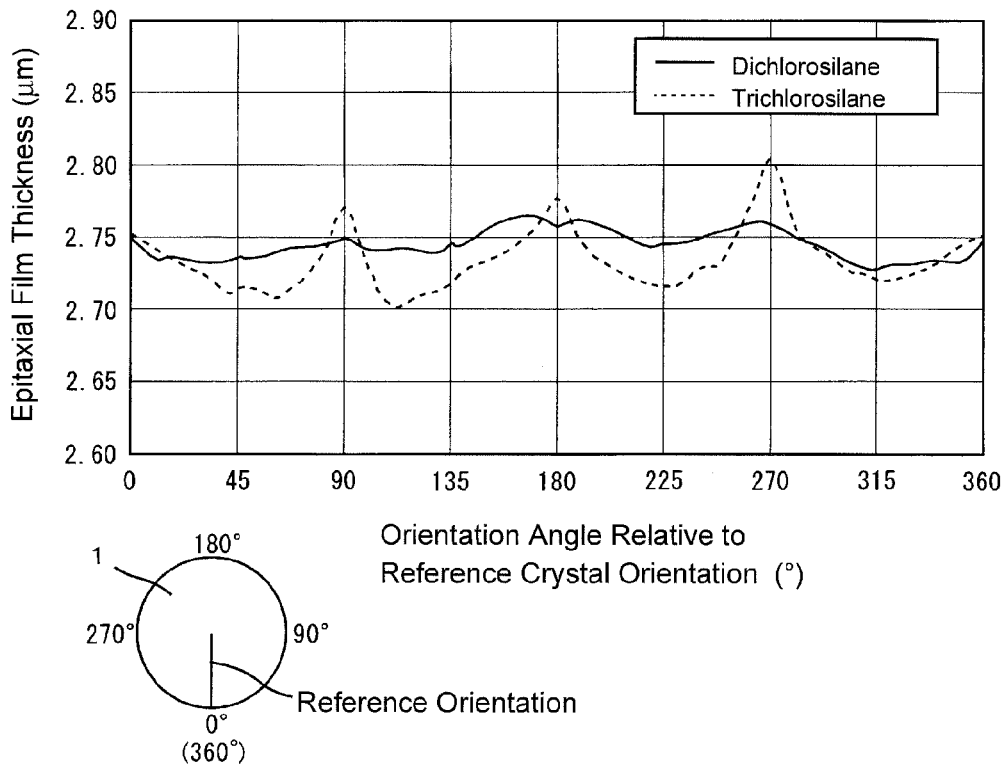
FIG. 5 is a view showing orientation dependence of growth rate of epitaxial wafer when trichlorosilane or dichlorosilane is used as source gas.

FIG. 5 is a view showing the orientation dependence of growth rate of an epitaxial wafer of 300 mm in diameter when either trichlorosilane or dichlorosilane is used as source gas. Table 1 shows, essential conditions used in the epitaxial growth for each source gas.

TABLE 1

|  | Source Gas | |
| --- | --- | --- |
|  | Dichlorosilane | Trichlorosilane |
| Epitaxial Growth Temp. (° C.) | 1050 | 1110 |
| Source Gas Flow Rate (slm) | 1.0 | 10.0 |
| Epitaxial Growth Time (sec.) | 180 | 90 |
| Preannealing Temp. (° C.) | 1080 | 1110 |
| Carrier Gas (H2) Flow Rate (slm) | 85 | 85 |

In Table 1, the "slm", which is a flow rate unit, indicates a flow rate (litter) per minute under 1 atmospheric pressure and 0° C. The "preannealing temperature" is a treatment temperature in preannealing treatment (referred also to as baking treatment) which is performed to the silicon wafer prior to the epitaxial growth. The annealing treatment will be described later.

In FIG. 5, the vertical axis denotes the epitaxial film thickness, and the horizontal axis does orientation angles on a surface of an epitaxial wafer 1, the orientation angles around a circle (to 360°) being represented counterclockwise relative to <011> crystal orientation as reference (0°), as shown at the bottom-left portion of FIG. 5. It should be noted that the measurement of the epitaxial film thickness is performed at 2 mm inwardly away from the outer periphery of the epitaxial wafer 1.

As shown in FIG. 5, when trichlorosilane is used as source gas, the epitaxial film thickness increases along four orientations of 90°, 180°, 270° and 360° (namely, 0°) due to high epitaxial growth rate therein, and recessed portions (valleys) are formed between neighboring orientations among them. Namely, the orientation dependence of epitaxial growth rate is large and heavy. In contrast, when dichlorosilane is used as source gas, such orientation dependence of growth rate (4FS) is hardly observed.

The epitaxial growth of the silicon layer on the surface of the silicon wafer can be performed by applying the conventionally-used CVD method.

In the method for producing an epitaxial wafer of the third invention, the reason for specifying the epitaxial growth temperature to be in the range of 900 to 1150° C. is that an epitaxial wafer with significantly reduced orientation dependence of growth rate can be obtained by epitaxially growing a silicon in this temperature range.

The epitaxial growth temperature below 900° C. interferes the progression of thermal decomposition or reducing reaction of dichlorosilane that is a source gas, and smooth epitaxial growth is prevented. On the other hand, when the growth temperature exceeds 1150° C., the resulting wafer cannot be used as a substrate material for highly-integrated semiconductor devices due to its worsened haze level.

In the method for producing an epitaxial wafer of the third invention, it is further specified to reduce the orientation dependence of growth rate of the resulting epitaxial wafer. Namely, the quality characteristics of the resulting epitaxial wafer are specified.

To "reduce" the orientation dependence of growth rate means that the orientation dependence of growth rate is reduced down below a orientation dependence of growth rate in a case in which trichlorosilane is used as source gas, and the epitaxial growth temperature is controlled so as to be within the feed dominant territory suitable for epitaxial growth. As described above, this can be secured by using dichlorosilane as source gas and performing the epitaxial growth within the range of 900 to 1150° C.

If the orientation dependence of epitaxial growth rate is evaluated with a film thickness of an epitaxial layer in the orientation of 45° relative to the reference crystal orientation, and given that a film thickness of the epitaxial layer in the reference crystal orientation be taken as 1, it is preferred, in the method for producing an epitaxial wafer of the third invention, to adopt an embodiment in which a film thickness of an epitaxial layer in the orientation of 45° is 0.985 or more. This relative epitaxial film thickness is not more than 0.985 for the orientation dependence of growth rate of the current status, and the degree of the reduction in orientation dependence of growth rate can be objectively and quantitatively evaluated.

Figure 6:
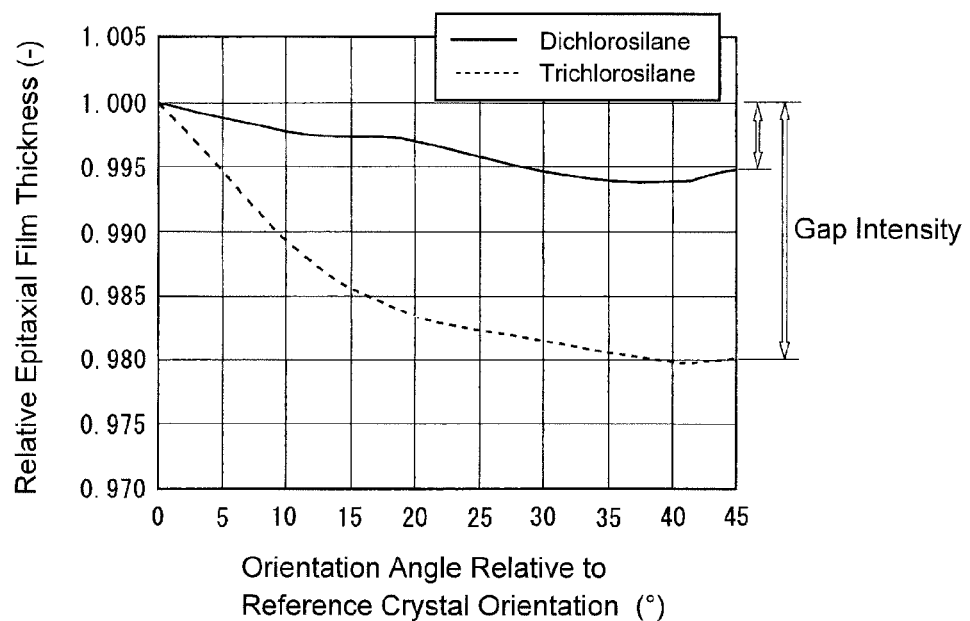
FIG. 6 is a view graphically illustrating relationship between the orientation angle relative to reference crystal orientation and the epitaxial film thickness.

FIG. 6 is a view graphically illustrating a relationship between the orientation angle relative to the reference crystal orientation and the epitaxial film thickness. In this figure, the horizontal axis represents orientation angles up to 45° relative to the reference crystal orientation (0°) in the above-mentioned FIG. 5, that is, the 45° orientation angle lying midway between reference angle (0°) and 90° of crystal orientation along which the epitaxial film thickness increases, and the vertical axis represents the relative epitaxial film thickness which is expressed with the epitaxial film thickness along reference crystal orientation (0°) being taken as 1.

In FIG. 6, when trichlorosilane is used as source gas, the epitaxial film thickness reduces as the orientation angle relative to reference crystal orientation becomes larger, and reaches 0.980 at 45° in terms of the relative thickness. The difference 0.020 (2.0% in percentage) between reference epitaxial film thickness (1.000, along reference crystal orientation) and the epitaxial film thickness along 45° (0.980) is herein referred to as "gap intensity".

On the other hand, when dichlorosilane is used as source gas, such reduction of the epitaxial film thickness is very small, ending up in about 0.995 along 45° in terms of the relative thickness. The gap intensity is about 0.005 (0.5%) (indicated by outlined arrows in the drawing). Namely, by using dichlorosilane as source gas in this example, the gap intensity can be reduced from a conventional gap intensity of about 2% down to about 0.5%, and thus the orientation dependence of epitaxial growth rate can be significantly reduced.

In this way, in a method for producing an epitaxial wafer according to a third invention, when the orientation dependence of growth rate is evaluated with a film thickness of an epitaxial layer along the orientation of 45° relative to reference crystal orientation, given that a film thickness of the epitaxial layer along reference crystal orientation be taken as 1, if the relative thickness should be 0.985 or more, the orientation dependence of growth rate can be reduced, and the extent of this reduction can be quantitatively evaluated.

In the method for producing an epitaxial wafer of the third invention, it is preferred to adopt an embodiment in which the epitaxial growth temperature range is set in the range of 1000 to 1150° C., and the flatness, evaluated with edge roll-off of the resulting epitaxial wafer, is made substantially equivalent to or more excellent than the current state.

Since the above-mentioned temperature of 1000 to 1150° C. corresponds to the feed dominant territory when dichlorosilane is used as source gas, the temperature dependence of epitaxial growth rate is reduced, and thus the epitaxial film thickness can be accurately controlled.

In this embodiment, the flatness, evaluated with edge roll-off of the resulting epitaxial wafer, further turns substantially equivalent to or more excellent than the current status. The fact that the flatness (edge roll-off) turns "substantially equivalent to or more than the current status" means that the flatness is kept substantially equivalent to or kept more satisfactory than the flatness of an epitaxial wafer which is obtained in the case that trichlorosilane is used as source gas, and the epitaxial growth temperature is controlled so as to be within the feed dominant territory.

In order to make this flatness substantially equivalent to or more excellent than the current state, it is necessary to appropriately control the flow rate (the feed rate to CVD reactor) of dichlorosilane used as source gas, as described below.

The above-mentioned FIG. 4 shows that, when the epitaxial growth temperature is 1000° C., the edge roll-off gets large with the increase of flow rate of dichlorosilane; however, the edge roll-off can be maintained within an extremely low range of −15 nm to +3 nm by setting the flow rate to, for example, 1.0 or less. As shown in examples, which will be described later, the edge roll-off of the resulting epitaxial wafer can be controlled to be substantially equivalent to or more excellent than the current status also by setting the epitaxial growth temperature to an appropriate temperature within the range of 1000 to 1150° C.

Concretely, in this embodiment, the edge roll-off can be controlled in the range of −14 nm to +14 nm, and further narrower range up to +2 nm by selecting a further appropriate temperature (e.g., 1050° C.) as the epitaxial growth temperature (refer to Inventive Example 24 in Table 4 of the examples to be described below).

In the method for producing an epitaxial wafer of the third invention (including embodiments), the silicon wafer is preferably subjected to preannealing (baking) treatment prior to the epitaxial growth. The reason is the same as in the method for producing an epitaxial wafer of the second invention.

This preannealing treatment is preferably performed at a temperature higher than the epitaxial growth temperature. Concretely, when the epitaxial growth temperature is 1050° C., a good result can be obtained by performing the preannealing treatment at 1080° C. in carrier gas ($H_2$) atmosphere. In a test which was performed to obtain the result shown in the above-mentioned FIG. 5, also, the preannealing treatment was performed at 1080° C. prior to the epitaxial growth at 1050° C.

As has been described so far, according to the method for producing an epitaxial wafer of the third invention (including embodiments), dichlorosilane is used as source gas, a silicon layer is epitaxially grown on a surface of a silicon wafer at a predetermined temperature (in the range of 900 to 1150° C., preferably 1000 to 1150° C.), and a resulting epitaxial wafer attains predetermined quality characteristics.

Namely, the production is performed so that the orientation dependence of growth rate of the resulting epitaxial wafer is reduced and, furthermore, the flatness, expressed by edge roll-off, of the wafer is controlled to be substantially equivalent to or more excellent than the current status.

In addition, the epitaxial growth temperature can be reduced by using the dichlorosilane, and effects of improvement in productivity and reduction in power consumption in associated equipment such as a CVD reactor can be also obtained by shortening time of temperature rising/lowering in the epitaxial growth.

As described above, the epitaxial wafer of the third invention is an epitaxial wafer for which dichlorosilane is used as source gas, and a silicon layer is epitaxially grown on a surface of a silicon wafer, and the epitaxial wafer of the third invention is characterized in that orientation dependence of growth rate of the wafer is reduced.

A preferred embodiment of the epitaxial wafer of the third invention is: when the orientation dependence of epitaxial growth rate in the wafer is evaluated with a film thickness of an epitaxial layer along the orientation of 45° relative to reference crystal orientation, given that a film thickness of the epitaxial layer along reference crystal orientation be taken as 1, a film thickness (relative) of an epitaxial layer along the orientation of 45° is 0.985 or more.

In a more preferred embodiment of the epitaxial wafer of the third invention, the flatness of the epitaxial wafer is within a range of −14 nm to +14 nm in terms of edge roll-off, in addition to the feature as the orientation dependence of epitaxial growth rate in the wafer being 0.985 or more as described above.

Namely, the epitaxial wafer of the third invention (including embodiments) is a wafer including an epitaxial layer obtained by using dichlorosilane as source gas, being characterized by quality characteristics to be incorporated into the epitaxial wafer, which are ensured by the production method. Accordingly, the epitaxial wafer of the third invention can be obtained by applying the above-mentioned method for producing an epitaxial wafer of the third invention.

For the epitaxial wafer of the third invention, the orientation dependence of epitaxial growth rate, which normally occurs in the outer peripheral zone of a wafer, is significantly reduced as described above, and further, the edge roll-off can be kept lower. According to this, this epitaxial wafer can correspond to stricter specifications of flatness due to higher integration of semiconductor devices, requirements of user side for extending an available area where the flatness is secured, and the like, and further can secure a satisfactory device fabrication yield.

EXAMPLES

Examples in "First Invention"

A mixed gas of trichlorosilane and dichlorosilane was used as source gas, and a silicon layer was epitaxially grown on a surface of a silicon wafer of 300 mm in diameter by the CVD method. At that time, the epitaxial growth temperature varied within a range from 1000 to 1100° C., and the haze level, edge roll-off, orientation dependence of growth rate (4FS), and epitaxial growth rate were measured for epitaxial wafers obtained by epitaxially growing at each growth temperature.

For comparison, the measurements were similarly performed for one case in which trichlorosilane was used as source gas (referred to as Conventional Example because conventional trichlorosilane was used), and for other case in which dichlorosilane was used as source gas (Comparative Example).

The measurement results are summarized in Table 2. The negative prefix "−" attached to numerical values in the column of "edge roll-off" of Table 2 indicates downward warpage of edge portion in an epitaxial wafer. Numerical values without the sign "−" means upward warpage.

TABLE 2

| | | Source Gas Flow Rate (slm) | | Growth | | Haze Level | Growth Rate | 4FS | Edge Roll-off |
|---|---|---|---|---|---|---|---|---|---|
| | | Trichlorosilane | Dichlorosilane | Temp. (° C.) | Temperature Territory | (ppm) | (μm/min) | (—) | (nm) |
| Conventional Example | 1 | 10 | 0 | 1000 | Reaction dominant | 0.050 | 1.387 | 0.980 | −61.2 |
| | 2 | 10 | 0 | 1050 | Reaction dominant | 0.064 | 1.909 | 0.978 | −48.6 |
| | 3 | 10 | 0 | 1070 | Reaction dominant | 0.080 | 2.062 | 0.977 | −38.8 |
| | 4 | 10 | 0 | 1100 | Feed dominant | 0.119 | 2.170 | 0.980 | −10.2 |
| | 5 | 10 | 0 | 1110 | Feed dominant | 0.133 | 2.202 | 0.980 | −1.3 |
| | 6 | 10 | 0 | 1130 | Feed dominant | 0.168 | 2.228 | 0.982 | 2.2 |
| | 7 | 10 | 0 | 1150 | Feed dominant | 0.203 | 2.245 | 0.982 | 3.4 |
| | 8 | 10 | 0 | 1180 | Feed dominant | 0.237 | 2.278 | 0.981 | 12.2 |
| Comparative Example | 1 | 0 | 1 | 900 | Reaction dominant | 0.051 | 0.395 | 0.992 | −52.3 |
| | 2 | 0 | 1 | 925 | Reaction dominant | 0.055 | 0.522 | 0.994 | −52.7 |
| | 3 | 0 | 1 | 950 | Reaction dominant | 0.056 | 0.639 | 0.994 | −48.3 |
| | 4 | 0 | 1 | 1000 | Feed dominant | 0.065 | 0.791 | 0.993 | −14.0 |
| | 5 | 0 | 1 | 1050 | Feed dominant | 0.077 | 0.836 | 0.992 | 2.0 |
| | 6 | 0 | 1 | 1080 | Feed dominant | 0.105 | 0.836 | 0.994 | 10.3 |
| | 7 | 0 | 1 | 1110 | Feed dominant | 0.183 | 0.832 | 0.993 | 13.2 |
| | 8 | 0 | 1 | 1150 | Feed dominant | 0.226 | 0.829 | 0.993 | 14.0 |
| Inventive Example | 1 | 5 | 0.5 | 1000 | Reaction dominant | 0.055 | 1.260 | 0.988 | −25.6 |
| | 2 | 5 | 0.5 | 1040 | Feed dominant | 0.066 | 1.535 | 0.987 | −9.8 |
| | 3 | 5 | 0.5 | 1050 | Feed dominant | 0.070 | 1.565 | 0.988 | −6.5 |
| | 4 | 5 | 0.5 | 1060 | Feed dominant | 0.078 | 1.581 | 0.988 | −2.2 |
| | 5 | 5 | 0.5 | 1100 | Feed dominant | 0.125 | 1.682 | 0.989 | 5.8 |
| | 6 | 4 | 0.6 | 1000 | Reaction dominant | 0.057 | 1.221 | 0.989 | −30.2 |
| | 7 | 4 | 0.6 | 1050 | Feed dominant | 0.068 | 1.422 | 0.990 | −12.2 |
| | 8 | 4 | 0.6 | 1060 | Feed dominant | 0.071 | 1.502 | 0.989 | −8.6 |

TABLE 2-continued

| Source Gas Flow Rate (slm) | | Growth | | Haze Level | Growth Rate | 4FS | Edge Roll-off |
|---|---|---|---|---|---|---|---|
| Trichlorosilane | Dichlorosilane | Temp. (° C.) | Temperature Territory | (ppm) | (μm/min) | (—) | (nm) |
| 9 | 4 | 0.6 | 1080 | Feed dominant | 0.070 | 1.565 | 0.990 | 1.1 |
| 10 | 6 | 0.4 | 1050 | Reaction dominant | 0.066 | 1.666 | 0.981 | −35.5 |
| 11 | 6 | 0.4 | 1080 | Feed dominant | 0.080 | 1.728 | 0.981 | −10.1 |

As shown in Table 2, with respect to Inventive Examples 1 to 11 for which a mixed gas of trichlorosilane and dichlorosilane was used as source gas, the haze level is apparently reduced, compared with Conventional Examples 4 to 6 (corresponding to conventional conditions for epitaxial growth, under which trichlorosilane is used as source gas, and an epitaxial growth temperature is set to 1100 to 1130° C.), concretely, reduced to a range corresponding to the haze level of polished wafer (0.050-0.080 ppm) or values close thereto. In a high-temperature area beyond 1080° C., however, the haze level tended to worsen depending on the mixing ratio of trichlorosilane and dichlorosilane.

With respect to Inventive Examples 1 to 11, the edge roll-off is maintained within a low range (from −20 nm to +20 nm) which is almost equivalent to the edge roll-off in the current status, although it is deteriorated in the reaction dominant territory with an epitaxial growth temperature of 1000° C. In addition, the orientation dependence of growth rate (4FS) is also improved, compared with the current status. However, no improvement effect was observed when the proportion of trichlorosilane in mixing was high.

Although the epitaxial growth rate is significantly reduced for Comparative Examples 1 to 8 for which only dichlorosilane was used as source gas, compared with the conventional examples in case of trichlorosilane, the extent of this reduction is remarkably moderated for Inventive Examples 1 to 11.

In the method for producing an epitaxial wafer of the first invention, by adopting an embodiment in which a preferable temperature range of epitaxial growth is set in the range of 1040 to 1080° C., the mixing ratio of trichlorosilane and dichlorosilane is preferably set in the proportion of 0.10 to 0.15 part of dichlorosilane to 1 part of trichlorosilane (within a range of "5 parts of trichlorosilane:0.5 part of dichlorosilane" to "4 parts of trichlorosilane 0.6 part of dichlorosilane"), and further the temperature range of epitaxial growth is set in the feed dominant territory (Inventive Examples 2 to 4, 7 to 9), an epitaxial wafer which is excellent in haze level, flatness in terms of edge roll-off and orientation dependence of growth rate (4FS), respectively, can be produced.

It could be confirmed from the result of Table 2 that an epitaxial wafer which has a low haze level, an edge roll-off kept low, and reduced orientation dependence of growth rate (4FS) can be produced while maintaining a relatively high epitaxial growth rate by using the mixed gas of trichlorosilane and dichlorosilane as source gas and epitaxially growing the silicon layer on the surface of the wafer within a predetermined temperature range.

Examples of "Second Invention"

Dichlorosilane was used as source gas, and a silicon layer was epitaxially grown on a surface of a silicon wafer of 300 mm in diameter by the CVD method. At that time, the epitaxial growth temperature varied in the range of 900 to 1150° C., and the haze level and edge roll-off were measured for epitaxial wafers obtained by performing the epitaxial growth at the various growth temperatures.

The supply flow rate of the dichlorosilane to a CVD reactor (source gas flow rate) was set to 1 slm. This flow rate is included within a flow rate range, which was determined through preliminary experiments as flow rates capable of keeping the edge roll-off low (refer to FIG. 4).

The measurement results are summarized in Table 3. The negative prefix "−" attached to numerical values in the column of "edge roll-off" of Table 3 indicates downward warpage of edge portion in an epitaxial wafer. A numerical value without the sign "−" means upward warpage.

TABLE 3

| | | Source Gas Flow Rate (slm) | | Growth Temp. (° C.) | Temperature Territory | Haze Level (ppm) | Edge Roll-off (nm) |
|---|---|---|---|---|---|---|---|
| | | Tri-chloro-silane | Di-chloro-silane | | | | |
| Comparative Example | 9 | 10 | 0 | 1000 | Reaction dominant | 0.050 | −61.2 |
| | 10 | 10 | 0 | 1050 | Reaction dominant | 0.064 | −48.6 |
| | 11 | 10 | 0 | 1070 | Reaction dominant | 0.080 | −38.8 |
| | 12 | 10 | 0 | 1100 | Feed dominant | 0.119 | −10.2 |
| | 13 | 10 | 0 | 1110 | Feed dominant | 0.133 | −1.3 |
| | 14 | 10 | 0 | 1130 | Feed dominant | 0.168 | 2.2 |
| | 15 | 10 | 0 | 1150 | Feed dominant | 0.203 | 3.4 |
| | 16 | 10 | 0 | 1180 | Feed dominant | 0.237 | 12.2 |
| Inventive Example | 12 | 0 | 1 | 900 | Reaction dominant | 0.051 | −52.3 |
| | 13 | 0 | 1 | 925 | Reaction dominant | 0.055 | −52.7 |
| | 14 | 0 | 1 | 950 | Reaction dominant | 0.056 | −48.3 |
| | 15 | 0 | 1 | 1000 | Feed dominant | 0.065 | −14.0 |
| | 16 | 0 | 1 | 1050 | Feed dominant | 0.077 | 2.0 |
| | 17 | 0 | 1 | 1080 | Feed dominant | 0.105 | 10.3 |
| | 18 | 0 | 1 | 1110 | Feed dominant | 0.183 | 13.2 |
| | 19 | 0 | 1 | 1150 | Feed dominant | 0.226 | 14.0 |

As shown in Table 3, Inventive Examples 12 to 19, for which dichlorosilane was used as source gas, are low in the haze level, and their haze levels are reduced to a range corresponding to the haze level of polished wafer (0.050 to 0.080 ppm) or values close thereto. However, the haze levels tended to worsen in a high-temperature area of 1080° C. or higher.

In one preferred embodiment of the method for producing an epitaxial wafer of the second invention, a desirable temperature region for epitaxial growth is set in the range of 1000 to 1050° C. (Inventive Examples 15 and 16). The haze level in this case is equivalent to the haze level of polished wafer. In addition, the haze level in this case is apparently reduced, compared with Comparative Examples 12 to 14 (corresponding to the conventional conditions for epitaxial growth: trichlorosilane is used as source gas, and epitaxial growth temperature is set in the range of 1100 to 1130° C.).

With respect to Inventive Examples 12 to 19, their edge roll-offs are maintained in a low range (−14 nm to +14 nm) almost equivalent to the edge roll-off of the current status, although they are deteriorated when performed in the reaction dominant temperature territory with an epitaxial growth temperature in the range of 900 to 950° C. In particular, Inventive Examples 15 and 16, which are preferred embodiments of the method for producing an epitaxial wafer of the second invention, had edge roll-offs that are equivalent to edge roll-offs of Comparative Examples 12 to 14 corresponding to the conventional conditions for epitaxial growth.

It could be confirmed from the result of Table 3 that, in order to obtain an epitaxial wafer which has a low haze level, and an edge roll-off kept low, dichlorosilane is used as source gas, a flow rate of the source gas and the like are appropriately adjusted, a silicon layer is epitaxially grown on a silicon wafer surface at a temperature range of 900 to 1150° C., preferably in the feed dominant territory of dichlorosilane (1000 to 1150° C.), more preferably at a temperature range of 1000 to 1050° C.

Example of "Third Invention"

Dichlorosilane was used as source gas, and a silicon layer was epitaxially grown on a surface of a silicon wafer of 300 mm in diameter by the CVD method. At that time, the epitaxial growth temperature varied in the range of 900 to 1150° C., and the orientation dependence of epitaxial growth rate (4FS) and edge roll-off were measured for epitaxial wafers obtained by performing the epitaxial growth at each growth temperature.

The supply flow rate of dichlorosilane to a CVD reactor (source gas flow rate) was set to 1 slm. This flow rate is included within a flow rate range, which was determined through preliminary experiments on flow rates capable of keeping the edge roll-off low (refer to FIG. 4).

The measurement results are shown in Table 4. In Table 4, "4FS" evaluates the orientation dependence of epitaxial growth rate by a thickness of an epitaxial film along the orientation of 45° relative to the reference crystal orientation (0°), and indicates the epitaxial film thickness along the orientation of 45° as a relative film thickness with the epitaxial film thickness along the reference crystal orientation being taken as 1 (one).

TABLE 4

| | | Source Gas Flow Rate (slm) | | | | | Edge |
|---|---|---|---|---|---|---|---|
| | | Tri-chloro-silane | Di-chloro-silane | Growth Temp. (° C.) | Temperature Territory | 4FS (—) | Roll-off (nm) |
| Comparative Example | 17 | 10 | 0 | 1000 | Reaction dominant | 0.980 | −61.2 |
| | 18 | 10 | 0 | 1050 | Reaction dominant | 0.978 | −48.6 |
| | 19 | 10 | 0 | 1070 | Reaction dominant | 0.977 | −38.8 |
| | 20 | 10 | 0 | 1100 | Feed dominant | 0.980 | −10.2 |
| | 21 | 10 | 0 | 1110 | Feed dominant | 0.980 | −1.3 |
| | 22 | 10 | 0 | 1130 | Feed dominant | 0.982 | 2.2 |
| | 23 | 10 | 0 | 1150 | Feed dominant | 0.982 | 3.4 |
| | 24 | 10 | 0 | 1180 | Feed dominant | 0.981 | 12.2 |
| Inventive Example | 20 | 0 | 1 | 900 | Reaction dominant | 0.992 | −52.3 |
| | 21 | 0 | 1 | 925 | Reaction dominant | 0.994 | −52.7 |
| | 22 | 0 | 1 | 950 | Reaction dominant | 0.994 | −48.3 |
| | 23 | 0 | 1 | 1000 | Feed dominant | 0.993 | −8.0 |
| | 24 | 0 | 1 | 1050 | Feed dominant | 0.992 | 2.0 |
| | 25 | 0 | 1 | 1080 | Feed dominant | 0.994 | 10.3 |
| | 26 | 0 | 1 | 1110 | Feed dominant | 0.993 | 13.2 |
| | 27 | 0 | 1 | 1140 | Feed dominant | 0.993 | 14.0 |

As shown in Table 4, Inventive Examples 20 to 27, for which dichlorosilane was used as source gas, each has more than 0.985 in 4FS for the above-mentioned relative film thickness, showing that the orientation dependence of growth rate is remarkably reduced, compared with the current status (0.985).

In a preferred embodiment of the method for producing an epitaxial wafer of the third invention, a preferable temperature range of epitaxial growth is set in the range of 1000 to 1050° C. (Inventive Examples 23 to 27). In this case, the edge roll-off can be kept low in the range of −14 nm to +14 nm in addition to the large reduction of the orientation dependence of growth rate (4FS). Further, the edge roll-off can be controlled further in the narrower range up to +2 nm by selecting, for example, 1050° C. as the epitaxial growth temperature.

When Inventive Examples 20 to 27 are compared with Comparative Examples 17 to 24, it is apparent that Inventive Examples are more excellent in orientation dependence of growth rate (4FS) over the whole epitaxial growth temperature range. On the other hand, while each of Inventive Example 24 and Comparative Examples 21 to 23 similarly exhibit a low level of edge roll-off, the epitaxial growth temperature in this case was set to be very low for Inventive Example 24.

Namely, when an epitaxial wafer whose edge roll-off is kept at a low value is produced, temperature rising/lowering time can be shortened during epitaxial growth, and thus the productivity can be improved, and the power consumption in associated equipment such as the CVD reactor can be also reduced.

It could be confirmed from the result of Table 4 that an epitaxial wafer reduced in the orientation dependence of epitaxial growth rate can be produced by using dichlorosilane as source gas, and epitaxially growing a silicon layer on a surface of a silicon wafer at a temperature range of 900 to 1150° C., preferably at a temperature range of 1000 to 1150° C. In addition, the epitaxial wafer further with an edge roll-off being kept low can be produced by appropriately controlling a source gas flow rate and the like.

In the above-mentioned description for the "first invention" to the "third invention", a silicon layer is epitaxially grown on a surface of a silicon wafer of 300 mm in diameter by the CVD method. However, in case of a silicon wafer of 450 mm in diameter, when a silicon layer is epitaxially grown on a surface thereof, a much larger size of epitaxial growth apparatus is required.

In this regard, when trichlorosilane is used as source gas, and the epitaxial growth is performed at a temperature of 1100° C. or higher, the load of heat capacity applied to the epitaxial growth apparatus becomes excessive and the durability of the epitaxial growth apparatus is deteriorated.

Thus, it becomes highly likely that the epitaxial growth itself cannot be performed to a silicon wafer of 450 mm in diameter. To solve such a problem, it is effective to use dichlorosilane as source gas and perform the epitaxial growth at a temperature range of 1000 to 1050° C. for the treatment of a large silicon wafer of 450 mm or more in diameter.

INDUSTRIAL APPLICABILITY

According to methods for producing epitaxial wafer of the present invention (the first, second and third inventions), an epitaxial wafer which is low in haze level and excellent in flatness and reduced in orientation dependence of growth rate can be produced. Since the decrease of epitaxial growth rate due to the use of dichlorosilane is suppressed and contained within a specific range, the production efficiency of epitaxial wafer can be kept relatively high.

Epitaxial wafers of the present invention (the first, second and third inventions) can be produced by the above-mentioned methods of the present invention. This epitaxial wafer is immune from interfering with the measurement of minute-size particles since the haze level is low, and can be suitably used as a substrate material for highly-integrated semiconductor devices. Further, this epitaxial wafer has an extended available area for device fabrication, and can secure a satisfactory device fabrication yield, since the edge roll-off and orientation dependence of growth rate are kept lower.

Consequently, the present invention (the first, second and third inventions) can be widely used in the production of silicon wafers and semiconductor devices.

REFERENCE SIGNS LIST

1: Epitaxial wafer

What is claimed is:

1. A method for producing an epitaxial wafer by epitaxially growing a silicon layer on a surface of a silicon wafer, the method comprising:
using a mixed gas of trichlorosilane and dichlorosilane as source gas, and epitaxially growing the silicon layer within a temperature range of 1000 to 1100° C.; and
preventing a haze level of the resulting epitaxial wafer from getting worse than a haze level of polished wafer, and making the resulting epitaxial wafer excellent in flatness; and
the temperature region of the epitaxial growth is set in the range of 1040 to 1080° C.,
the haze level of the resulting epitaxial wafer is controlled in the range of 0.050 to 0.080 ppm when measured in DWN mode using a KLA-Tencor particle counter (SP-1), and
the flatness is improved so that edge roll-off is within a range of −20 nm to +20 nm, and when the orientation dependence of epitaxial growth rate is evaluated with a film thickness of an epitaxial layer along an orientation of 45° relative to reference crystal orientation, given that a film thickness of the epitaxial layer along reference crystal orientation be taken as 1, the film thickness of the epitaxial layer along the orientation of 45° is controlled to be 0.985 or more.

2. The method for producing an epitaxial wafer according to claim 1, further comprising:
reducing orientation dependence of epitaxial growth rate in the resulting wafer.

3. The method for producing an epitaxial wafer according to claim 1, wherein a mixing ratio of trichlorosilane and dichlorosilane is set, by volume, in the proportion of 0.066 to 0.15 part of dichlorosilane to 1 part of trichlorosilane.

4. The method for producing an epitaxial wafer according to claim 1, wherein the temperature region of the epitaxial growth is set in a feed dominant temperature territory.

5. The method for producing an epitaxial wafer according to claim 1, wherein the growth rate in the epitaxial growth of the silicon layer is set to be larger than 1.5 μm/min.

6. A method for producing an epitaxial wafer by epitaxially growing a silicon layer on a surface of a silicon wafer, comprising:
using dichlorosilane as source gas, and epitaxially growing the silicon layer within a temperature range of 900 to 1150° C.; and
preventing a haze level of the resulting epitaxial wafer from getting worse than a haze level of polished wafer and making the resulting epitaxial wafer excellent in flatness, and the temperature region of the epitaxial growth is set to a temperature range of 1000 to 1050° C.,
the haze level of the resulting epitaxial wafer is controlled in the range of 0.050 to 0.080 ppm when measured in DWN mode using a KLA-Tencor particle counter (SP-1), and
the flatness is improved so that edge roll-off is within a range of −14 nm to +14 nm.

7. The method for producing an epitaxial wafer according to claim 6, wherein the temperature region of the epitaxial growth is set in a feed dominant temperature territory.

8. The method for producing an epitaxial wafer according to claim 6, wherein the silicon wafer is subjected to preannealing treatment prior to the epitaxial growth.

9. The method for producing an epitaxial wafer according to claim 8, wherein the preannealing treatment is performed at a temperature higher than the epitaxial growth temperature.

10. A method for producing an epitaxial wafer by epitaxially growing a silicon layer on a surface of a silicon wafer, comprising:
using dichlorosilane as source gas, and epitaxially growing the silicon layer within a temperature range of 900 to 1150° C.; and
reducing orientation dependence of epitaxial growth rate in the resulting wafer wherein, when the orientation dependence of epitaxial growth rate is evaluated with a film thickness of the epitaxial layer along an orientation of 45° relative to reference crystal orientation, given that a film thickness of the epitaxial layer along reference crystal orientation be taken as 1, the film thickness of the epitaxial layer along the orientation of 45° is controlled to be 0.985 or more; and
wherein the flatness of the epitaxial wafer is within a range of −14 nm to +14 nm in terms of the edge roll-off.

11. The method for producing an epitaxial wafer according to claim 10, wherein the epitaxial growth temperature range is set in the range of 1000 to 1150° C., and flatness evaluated with edge roll-off of the resulting epitaxial wafer is controlled to be substantially equivalent to or more excellent than a current status.

12. The method for producing an epitaxial wafer according to claim 10, wherein the silicon wafer is subjected to preannealing treatment prior to the epitaxial growth.

13. The method for producing an epitaxial wafer according to claim 12, wherein the preannealing treatment is performed at a temperature higher than the epitaxial growth temperature.

* * * * *